US010125434B2

(12) United States Patent
Godfried et al.

(10) Patent No.: US 10,125,434 B2
(45) Date of Patent: *Nov. 13, 2018

(54) OPTICAL QUALITY DIAMOND MATERIAL

(71) Applicant: ELEMENT SIX TECHNOLOGIES LIMITED, Didcot, Oxfordshire (GB)

(72) Inventors: Herman Philip Godfried, Didcot (GB); Geoffrey Alan Scarsbrook, Didcot (GB); Daniel James Twitchen, Didcot (GB); Evert Pieter Houwman, Didcot (GB); Wilhemus Gertruda Maria Nelissen, Didcot (GB); Andrew John Whitehead, Didcot (GB); Clive Edward Hall, Didcot (GB); Philip Maurice Martineau, Didcot (GB)

(73) Assignee: Element Six Technologies Limited, London (GB)

( * ) Notice: Subject to any disclaimer, the term of this patent is extended or adjusted under 35 U.S.C. 154(b) by 18 days.

This patent is subject to a terminal disclaimer.

(21) Appl. No.: 15/374,071

(22) Filed: Dec. 9, 2016

(65) Prior Publication Data

US 2017/0183794 A1 Jun. 29, 2017

Related U.S. Application Data

(60) Continuation of application No. 14/462,690, filed on Aug. 19, 2014, now Pat. No. 9,551,090, which is a division of application No. 12/690,991, filed on Jan. 21, 2010, now Pat. No. 8,936,774, which is a division of application No. 10/717,566, filed on Nov. 21, 2003, now Pat. No. 7,740,824.

(30) Foreign Application Priority Data

Nov. 21, 2002 (GB) .................................. 0227261.5

(51) Int. Cl.
| | |
|---|---|
| C01B 31/06 | (2006.01) |
| C30B 29/04 | (2006.01) |
| C30B 25/02 | (2006.01) |
| G02B 1/00 | (2006.01) |
| C30B 9/00 | (2006.01) |
| C30B 19/02 | (2006.01) |
| C30B 25/16 | (2006.01) |
| C30B 25/20 | (2006.01) |
| C30B 33/12 | (2006.01) |
| G02B 1/02 | (2006.01) |
| C30B 33/02 | (2006.01) |
| C01B 32/25 | (2017.01) |

(52) U.S. Cl.
CPC .............. *C30B 29/04* (2013.01); *C01B 32/25* (2017.08); *C30B 9/00* (2013.01); *C30B 19/02* (2013.01); *C30B 25/02* (2013.01); *C30B 25/165* (2013.01); *C30B 25/20* (2013.01); *C30B 25/205* (2013.01); *C30B 33/02* (2013.01); *C30B 33/12* (2013.01); *G02B 1/002* (2013.01); *G02B 1/02* (2013.01); *C01P 2006/60* (2013.01); *C01P 2006/80* (2013.01)

(58) Field of Classification Search
CPC ...................................................... C01B 32/25
See application file for complete search history.

(56) References Cited

U.S. PATENT DOCUMENTS

| | | |
|---|---|---|
| 4,124,690 A | 11/1978 | Strong et al. |
| 4,174,380 A | 11/1979 | Strong et al. |
| 4,465,932 A | 8/1984 | Burgemeister |
| 4,950,625 A | 8/1990 | Nakashima et al. |
| 5,127,983 A | 7/1992 | Imai et al. |
| 5,270,028 A | 12/1993 | Tanabe et al. |
| 5,335,245 A | 8/1994 | Marie et al. |
| 5,443,032 A | 8/1995 | Vichr et al. |
| 5,451,430 A | 9/1995 | Anthony et al. |
| 5,474,021 A | 12/1995 | Tsuno et al. |
| 5,625,638 A | 4/1997 | Trost |
| 6,030,595 A | 2/2000 | Sumiya et al. |
| 6,096,129 A | 8/2000 | Saito et al. |
| 6,162,412 A | 12/2000 | Fujimori et al. |
| 6,210,780 B1 | 4/2001 | Fujii et al. |
| 6,582,513 B1 | 6/2003 | Linares et al. |
| 7,160,617 B2 | 1/2007 | Scarsbrook et al. |

(Continued)

FOREIGN PATENT DOCUMENTS

| | | |
|---|---|---|
| EP | 0316856 A1 | 5/1989 |
| EP | 0386727 A1 | 9/1990 |

(Continued)

OTHER PUBLICATIONS

U.S. Appl. No. 10/717,566, Restriction Requirement dated Jan. 11, 2007, 4 pages.
U.S. Appl. No. 10/717,566, Non-Final Office Action dated Nov. 2, 2007, 4 pages.
U.S. Appl. No. 10/717,566, Final Office Action dated May 21, 2008, 5 pages.
U.S. Appl. No. 10/717,566, Non-Final Office Action dated Feb. 4, 2009, 4 pages.
U.S. Appl. No. 10/717,566, Final Office Action dated Nov. 4, 2009, 4 pages.
U.S. Appl. No. 10/717,566, Notice of Allowance dated Feb. 17, 2010, 4 pages.
U.S. Appl. No. 12/690,991, Non-Final Office Action dated Sep. 8, 2010, 5 pages.
U.S. Appl. No. 12/690,991, Final Office Action dated Feb. 4, 2011, 5 pages.

(Continued)

*Primary Examiner* — Stuart L Hendrickson
(74) *Attorney, Agent, or Firm* — Dean W. Russell; Clark F. Weight; Kilpatrick Townsend & Stockton LLP

(57) ABSTRACT

A CVD single crystal diamond material suitable for use in, or as, an optical device or element. It is suitable for use in a wide range of optical applications such as, for example, optical windows, laser windows, optical reflectors, optical refractors and gratings, and etalons. The CVD diamond material is produced by a CVD method in the presence of a controlled low level of nitrogen to control the development of crystal defects and thus achieve a diamond material having key characteristics for optical applications.

16 Claims, 7 Drawing Sheets

(56) References Cited

U.S. PATENT DOCUMENTS

| | | | |
|---|---|---|---|
| 7,740,824 | B2 | 6/2010 | Godfried et al. |
| 8,986,645 | B2 | 3/2015 | Williams et al. |
| 8,986,646 | B2 | 3/2015 | Geoghegan et al. |
| 9,017,632 | B2 | 4/2015 | Geoghegan et al. |
| 9,017,633 | B2 | 4/2015 | Twitchen et al. |
| 9,551,090 | B2 * | 1/2017 | Godfried ................. C30B 25/02 |
| 2001/0031237 | A1 | 10/2001 | Vagarali et al. |
| 2002/0081260 | A1 | 6/2002 | Vagarali et al. |
| 2002/0172638 | A1 | 11/2002 | Vagarali et al. |
| 2004/0175499 | A1 | 9/2004 | Scarsbrook et al. |
| 2004/0177803 | A1 | 9/2004 | Scarsbrook et al. |
| 2004/0180205 | A1 | 9/2004 | Scarsbrook et al. |
| 2004/0182308 | A1 | 9/2004 | Scarsbrook et al. |
| 2004/0194960 | A1 | 10/2004 | Twitchen et al. |
| 2004/0221795 | A1 | 11/2004 | Twitchen et al. |

FOREIGN PATENT DOCUMENTS

| | | |
|---|---|---|
| EP | 0589464 A1 | 3/1994 |
| EP | 0615954 A1 | 9/1994 |
| EP | 0671482 A1 | 9/1995 |
| EP | 0674028 A2 | 9/1995 |
| EP | 0715885 A2 | 6/1996 |
| EP | 0594994 B1 | 3/1999 |
| JP | 1131014 A | 5/1989 |
| JP | H0288498 A | 3/1990 |
| JP | 6107494 A | 4/1994 |
| JP | 6263418 A | 9/1994 |
| JP | 7277890 A | 10/1995 |
| JP | 9165295 A | 6/1997 |
| JP | H111392 A | 1/1999 |
| JP | H1149596 A | 2/1999 |
| WO | 0114050 A1 | 3/2001 |
| WO | 0172404 A1 | 10/2001 |
| WO | 0172406 A1 | 10/2001 |
| WO | 0196634 A1 | 12/2001 |
| WO | 0213958 A2 | 2/2002 |
| WO | 03052174 A2 | 6/2003 |

OTHER PUBLICATIONS

U.S. Appl. No. 12/690,991, Examiner's Answer to Appeal Brief mailed Dec. 1, 2011, 6 pages.

U.S. Appl. No. 12/690,991, Patent Board Decision dated Jun. 17, 2014, 6 pages.

U.S. Appl. No. 12/690,991, Non-Final Office Action dated Sep. 4, 2014, 3 pages.

U.S. Appl. No. 12/690,991, Notice of Allowance dated Oct. 7, 2014, 5 pages.

U.S. Appl. No. 14/462,690, Non-Final Office Action dated Sep. 29, 2015, 7 pages.

U.S. Appl. No. 14/462,690, Final Office Action dated Apr. 27, 2016, 5 pages.

U.S. Appl. No. 14/462,690, Notice of Allowance dated Sep. 23, 2016, 5 pages.

U.S. Appl. No. 14/462,690, Notice of Allowance dated Nov. 29, 2016, 5 pages.

Freeman, G. P., et al., "Differences Between Counting and Non-Counting Diamonds, Part II: Birefringency and Luminescence," Physica, Jan. 1952, pp. 9-19, vol. XVIII, No. 1, Elsevier B.V., Amsterdam.

Burgemeister, E. A., "Dosimetry with a Diamond Operating as a Resistor," Phys. Med. Biol. 1981, pp. 269-275, vol. 26, No. 2, The Institute of Physics, Great Britain.

McCormick, Terri L., et al., "The characterization of strain, impurity content, and crush strength of synthetic diamond crystals," Journal of Materials Research, Jan. 1997, pp. 253-263, vol. 12, No. 1, Materials Research Society, United States.

Janssen, G., et al., "Rapid growth of single-crystal diamond on diamond substrates," Surface and Coatings Technology, 1991, pp. 113-126, vol. 47, Elsevier B.V., Amsterdam.

Janssen, G., et al., "Characterization of single-crystal diamond grown by chemical vapour deposition processes," Diamond and Related Materials, May 1, 1992, pp. 789-800, vol. 1, No. 7, Elsevier Science Publishers B.V., Amsterdam.

Badzian, Andrzej, et al., "Diamond homoepitaxy by chemical vapor deposition," Diamond and Related Materials, Mar. 31, 1993, pp. 147-157, vol. 2, Nos. 2-4, Elsevier Sequoia.

Klein, Claude A., "Diamond windows for IR applications in adverse environments," Diamond and Related Materials, Apr. 13, 1993, pp. 1024-1032, vol. 2, Nos. 5-7, Elsevier Sequoia.

Shigley, James E., et al., "Two Near-Colorless General Electric Type-IIA Synthetic Diamond Crystals," Gems & Gemology, Fall 1993, pp. 191-197, vol. 29, No. 3, Gemological Institute of America, United States.

Schermer, J. J., et al., "Flame deposition and characterization of large type IIA diamond single crystals," Diamond and Related Materials, Apr. 1994, pp. 408-416, vol. 3, Nos. 4-6, Elsevier Sequoia.

McCauley, Thomas S., et al., "Homoepitaxial diamond film deposition on a brilliant cut diamond anvil," Appl. Phys. Lett., Mar. 20, 1995, pp. 1486-1488, vol. 66, No. 12, American Institute of Physics, United States.

Samlenski, R., et al., "Characterisation and lattice location of nitrogen and boron in homoepitaxial CVD diamond," Diamond and Related Materials, Jul. 1996, pp. 947-951, vol. 5, No. 9, Elsevier Science S.A.

Lee, Naesung, et al., "A study on surface morphologies of (001) homoepitaxial diamond films," Diamond and Related Materials, 1997, pp. 130-145, vol. 6, Elsevier Science S.A.

Sumiya, H., et al., "Crystalline perfection of high purity synthetic diamond crystal," Journal of Crystal Growth, 1997, pp. 485-494, vol. 178, Elsevier Science B.V., Amsterdam.

Yan, Chih-Shiue, et al., "Multiple twinning and nitrogen defect center in chemical vapor deposited homoepitaxial diamond," Diamond and Related Materials, May 1999, pp. 2022-2031, vol. 8, Elsevier Science S.A.

Schmetzer, Karl, "Clues to the Process Used by General Electric to Enhance the GE POL Diamonds," Gems & Gemology, Winter 1999, pp. 186-190, vol. 35, No. 4, Gemological Institute of America, United States.

Badzian, Andrzej, "Chapter 15: Synthesis of Diamond from the Gas Phase," Electric Refractory Materials, 2000, pp. 347-368, Marcel Dekker, Inc., New York, NY.

Iakoubovskii, Konstantin, et al., "Nitrogen incorporation in diamond films homoepitaxially grown by chemical vapour deposition," J. Phys. Condens. Matter, 2000, pp. L519-L524, vol. 12, No. 30, IOP Publishing Ltd., United Kingdom.

Fisher, David, et al., "Spectroscopic Evidence of GE POL HPHT-Treated Natural Type IIA Diamonds," Gems & Gemology, Spring 2000, pp. 42-49, vol. 36, No. 1, Gemological Institute of America, United States.

Butler, J. E., et al., "Analysis of Large Single Crystal CVD Diamond," Presented at the United States Naval Research Academy, Jul. 22, 2000, United States.

Wang, Chunlei, et al., "Growth and characterization of hillock-free high quality homoepitaxial diamond films," Diamond and Related Materials, Sep.-Oct. 2000, pp. 1650-1654, vol. 9, Nos. 9-10, Elsevier Science S.A.

Iakoubovskii, K., et al., "Nitrogen incorporation in CVD diamond," Diamond and Related Materials, 2001, pp. 485-489, vol. 10, Elsevier Science S.A.

King, John M., et al., "Characterization and Grading of Natural-Color Pink Diamonds," Gems & Gemology, Summer 2002, pp. 128-147, vol. 38, No. 2, Gemological Institute of America, United States.

Isberg, Jan, et al., "High Carrier Mobility in Single-Crystal Plasma-Deposited Diamond," Science, Sep. 6, 2002, pp. 1670-1672, vol. 297, Issue 5587, American Association for the Advancement of Science, United States.

Kennedy, T. A., et al., "Single-Qubit Operations with the Nitrogen-Vacancy Center in Diamond," phys. stat. sol. (b), 2002, pp. 416-426, vol. 23, No. 3, Wiley-VCH Verlag GmbH & Co. KGaA, Weinheim, Germany.

(56) References Cited

OTHER PUBLICATIONS

Yan, Chih-Shiue, et al., "Very high growth rate chemical vapor deposition of single-crystal diamond," PNAS, Oct. 1, 2002, pp. 12523-12525, vol. 99, No. 20, Proceedings of the National Academy of Sciences (PNAS), Washington, DC.

Royen, J. Van, et al., "High-pressure—high-temperature treatment of natural diamonds," J. Phys. Condens. Matter, Oct. 25, 2002, pp. 10953-10956, vol. 14, IOP Publishing Ltd., United Kingdom.

Adam, W., Bruzzi, M., et al., "Status of the R&D activity on diamond particle detectors," Nuclear Instruments and Methods in Physics Research A, 2003, pp. 124-131, vol. 511, Elsevier B.V., Amsterdam.

Butler, J. E., et al., "Characterization of HPHT Annealed Single Crystal CVD Diamond," Presented at the Annual Diamond Physics Meeting, Jul. 2003, Office of Naval Research/Naval Research Laboratory, Washington, DC.

Houwman, E. P., et al., "Diamond Solid Etalons for High-Stability DWDM Wavelength-Lockers," Presented at the ECOC-IOOC 2003, 29th European Conference on Optical Communication and 14th International Conference on Integrated Optics and Optical Fibre Communication held in Rimini, Italy, Sep. 21-25, 2003, 2 pages.

Sumitomo Electric Industries, LTD., "Development of Diamond Crystal Enlarging Technology (A paper entitled 'Development of large size diamond synthesis process')," Report on R&D on "Frontier Carbon Technology" (FCT) project by New Energy Development Organisation (NEDO), 2000, 12 pages.

Butler, James E., "Chemical Vapor Deposited Diamond: Maturity and Diversity," The Electrochemical Society Interface, Spring 2003, pp. 22-26, vol. 12, No. 1, ECS Digital Library, Pennington, NJ.

Grot, S. A., et al., "Selective Deposition of Homoepitaxial Diamond Film," Proc. $2^{nd}$ Int'l. Conf. on Elec. Mats., 1990, pp. 633-637, Materials Research Society, Warrendale, PA.

Mitsuhashi, Masahiko, et al., "Dislocation of epitaxial CVD diamond and the characterization by Raman spectroscopy," Applied Surface Science, 1992, pp. 565-572, vol. 60/61, Elsevier Science Publishers B.V., Amsterdam.

Collins, Alan T., "The colour of diamond and how it may be changed," Journal of Gemmology, 2001, pp. 341-359, vol. 27, No. 6, Gemmological Association and Gem Testing Laboratory of Great Britain.

Lazare Kaplan International (LKI), "Pegasus Overseas Limited, Lazare Kaplan International, General Electric Company—Press Release," Diamonds.net, Mar. 25, 1999, 2 pages.

Smith, Christopher P., et al., "GE POL Diamonds: Before and After," Gems & Gemology, Fall 2000, pp. 192-215, vol. 36, No. 3, Gemological Institute of America, United States.

Evans, T., et al., "The kinetics of the aggregation of nitrogen atoms in diamond," Proc. R. Soc. Lond., 1982, pp. 159-178, vol. A 381, Great Britain.

Sumiya, H., et al., "High-pressure synthesis of high-purity diamond crystal," Diamond and Related Materials, 1996, pp. 1359-1365, vol. 5, Elsevier Science S.A.

Zaitsev, A. M., "Chapter 5: Optical Electronic Transitions," Optical Properties of Diamond, 2000, pp. 125-376, Springer-Verlag, Berlin/Heidelberg, Germany.

Collins, Alan T., et al., "Colour changes produced in natural brown diamonds by high-pressure, high-temperature treatment," Diamond and Related Materials, 2000, pp. 113-112, vol. 9, Elsevier Science S.A.

Samlenski, R., et al., "Incorporation of nitrogen in chemical vapor deposition diamond," Applied Phys. Lett., Nov. 6, 1995, pp. 2798-2800, vol. 67, No. 19, American Institute of Physics.

Kania, P., et al., "Photoluminescence study of <100> textured CVD diamonds," Diamond and Related Materials, 1995, pp. 425-428, vol. 4, Issue 4, Elsevier B.V.

Tsuno, T., et al., "Characterization of Thick Homoepitaxial Film on Diamond (001) Substrate II," JNDF $9^{th}$ Daimond Symposium, Abstracts, Nov. 21, 1995, pp. 60-61 (with English translation).

Tsuno, T., et al., "Homoepitaxial growth of diamond (001) with nitrogen doping," Extended Abstracts, The $56^{th}$ Autumn Meeting, Aug. 26, 1995, p. 377, No. 2(with English translation), The Japanese Society of Applied Physics.

Michler, J., et al., "Complementary application of electron microscopy and micro-Raman spectroscopy for microstructure, stress, and bonding defect investigation of heteroepitaxial chemical vapor deposited diamond films," Journal of Applied Physics, Jan. 1, 1998, pp. 187-197, vol. 83, No. 1, American Institute of Physics.

Locher, R., et al., "Nitrogen stabilized <100> texture in chemical vapor deposited diamond films," Appl. Phys. Letters, Jul. 4, 1994, pp. 34-36, vol. 65, No. 1, American Institute of Physics.

Vlasov, I. I., et al., "Relateive Abundance of Single and Vacancy-Bonded Substitutional Nitrogen in CVD Diamond," Physica Status Solidi (a), Sep. 2000, pp. 83-90, vol. 181, Issue 1, Wiley-VCH Verlag GmbH & Co. KGaA, Weinheim, Germany.

Pehrsson, Pehr E., "Chemistry and the Electronic Properties of Diamond Surfaces," Mat. Res. Soc. Symp. Proc., Jan. 1995, pp. 51-56, vol. 416, Materials Research Society.

* cited by examiner t<<R, R = 400 mm

Fig. 10

|     | 0.5 | 0.4 | 0.5 | 0.6 |     |
|-----|-----|-----|-----|-----|-----|
| 0.6 | 0.2 | 0.1 | 0.2 | 0.2 |     |
| 0.6 | 0.4 | 0.2 | 0.2 | 0.3 | 0.3 |
| 0.3 | 0.3 | 0.1 | 0.3 | 0.5 | 0.2 |
| 0.3 | 0.4 | 0.9 | 0.4 | 0.2 | 0.2 |
|     | 0.7 | 0.3 | 0.9 | 0.6 | 0.6 |
|     | 0.8 | 0.8 | 0.7 | 0.9 |     |

Fig. 11

|     | 0.4 | 0.5 | 0.7 |     |     |
|-----|-----|-----|-----|-----|-----|
| 0.8 | 0.6 | 0.2 | 0.3 | 0.4 | 0.4 |
| 0.9 | 0.6 | 0.3 | 0.3 | 0.4 | 0.5 |
| 0.6 | 0.3 | 0.3 | 0.3 | 0.4 | 0.6 |
| 0.4 | 0.3 | 0.3 | 0.3 | 0.2 | 0.5 |
| 0.7 | 0.3 | 0.2 | 0.2 | 0.2 | 0.7 |
| 0.8 | 0.5 | 0.2 | 0.2 | 0.3 |     |

Fig. 12

|  |  | 0.4 | 0.6 | 0.9 |  |
|---|---|---|---|---|---|
| 0.9 | 0.5 | 0.6 | 0.9 | 0.8 | |
| 0.9 | 0.4 | 0.2 | 0.5 | 0.9 | |
| 0.3 | 0.2 | 0.2 | 0.1 | 0.5 | 0.5 |
| 0.4 | 0.2 | 0.2 | 0.1 | 0.6 | 0.5 |
| 0.4 | 0.2 | 0.2 | 0.2 | 0.5 | 0.6 |
|  | 0.6 | 0.4 | 0.4 | 0.5 | 0.6 |

Fig. 12

| 0.1 | 0.2 | 0.1 | 0.1 |
|---|---|---|---|
| 0.1 | 0.2 | 0.1 | 0.1 |
| 0.2 | 0.2 | 0.1 | 0.1 |
| 0.3 | 0.2 | 0.2 | 0.2 |
| 0.2 | 0.1 | 0.1 | 0.1 |
| 0.1 | 0.1 | 0.1 | 0.1 |

Fig. 13

OPTICAL QUALITY DIAMOND MATERIAL

CROSS-REFERENCE TO RELATED APPLICATIONS

This application is a continuation of U.S. patent application Ser. No. 14/462,690, filed on Aug. 19, 2014, which is a division of U.S. patent application Ser. No. 12/690,991, filed on Jan. 21, 2010, issued as U.S. Pat. No. 8,936,774 on Jan. 20, 2015, which is a division of U.S. patent application Ser. No. 10/717,566, filed on Nov. 21, 2003, issued as U.S. Pat. No. 7,740,824 on Jun. 22, 2010, which claims the benefit of United Kingdom Patent Application No. 0227261.5, filed on Nov. 21, 2002, each of which is incorporated herein by reference in its entirety.

BACKGROUND OF THE INVENTION

This invention relates to chemical vapour deposition (CVD) diamond material, its production and optical devices and elements arising from this material.

There is a range of optical devices which, as a result of their unique requirements, place high demands on the material used for them. Examples include laser windows, where high intensity beams need to pass undisturbed through a window which is required to provide some form of isolation, and other devices such as optical reflectors, diffraction gratings and etalons.

Depending on the particular application, key properties that may play a role in the selection or manufacturing of an appropriate material include low and uniform birefringence, uniform and high refractive index, low induced birefringence or refractive index variation as a function of strain, low and uniform optical absorption, low and uniform optical scatter, high optical (laser) damage threshold, high thermal conductivity (minimising temperature variation within the optical element), an ability to be processed to show a high surface polish together with high parallelism and flatness, mechanical strength, abrasion resistance, chemical inertness, and repeatability in the material parameters so that it is reliable in the application.

Many materials fulfill one or more of these requirements, but most applications require more than one, and often the material chosen is a compromise, limiting the final performance.

SUMMARY OF THE INVENTION

According to the present invention, a CVD single crystal diamond material shows at least one, preferably at least two, more preferably at least three, and even more preferably at least four of the following characteristics, when measured at room temperature (nominally 20° C.):

1) High optical homogeneity, with the transmitted wavefront (as for example measured by a ZYGO GPI phase shifting 633 nm Fizeau-type laser interferometer) differing from the expected geometrical wavefront during transmission through diamond of a specified thickness of at least 0.5 mm, preferably at least 0.8 mm and more preferably at least 1.2 mm, processed to an appropriate flatness, and measured over a specified area of at least 1.3 mm×1.3 mm, and preferably at least 2.5 mm×2.5 mm, and more preferably at least 4.0 mm×4.0 mm, by less than 2 fringes, and preferably by less than 1 fringe, and more preferably by less than 0.5 fringes, and even more preferably by less than 0.2 fringes, where 1 fringe corresponds to a difference in optical path length equal to ½ of the measurement wavelength of 633 nm.

2) An effective refractive index in samples of a specified thickness of at least 0.5 mm, preferably at least 0.8 mm and more preferably at least 1.2 mm, and measured over a specified area of at least 1.3 mm×1.3 mm, and preferably at least 2.5 mm×2.5 mm, and more preferably at least 4 mm×4 mm, which has a value of 2.3964 to within an accuracy of +/−0.002, and preferably to within an accuracy of +/−0.001, and more preferably to within an accuracy of +/−0.0005, when measured at wavelengths near 1.55 µm by scanning the frequency of the laser beam incident on the sample in the form of an etalon over the frequency range of 197-192 THz, recording the transmission of the sample etalon as a function of frequency, and applying the formula for the Free Spectral Range (equation 1 defined later). Those skilled in the art will understand that the value of 2.3964 is based on the diamond consisting of carbon isotopes in their natural abundance ratio, and that the value of 2.3964 will vary as the isotopic composition of the diamond varies.

3) Low optical birefringence, indicative of low strain such that in samples of a specified thickness of at least 0.5 mm, preferably at least 0.8 mm and more preferably at least 1.2 mm, measured over a specified area of at least 1.3 mm×1.3 mm, and preferably at least 2.5 mm×2.5 mm, and more preferably at least 4 mm×4 mm, the modulus of the sine of the phase shift, |sin δ|, as measured by a Deltascan or similar instrument with similar resolution using radiation in the range 545-615 nm and preferably 589.6 nm does not exceed certain limits. Specifically, these limits are that the modulus of the sine of the phase shift, |sin δ| for at least 98%, and more preferably for at least 99% and even more preferably for 100% of the analysed area of the sample remains in first order (δ does not exceed $\pi/2$) and that |sin δ| does not exceed 0.9, and preferably does not exceed 0.6, and more preferably does not exceed 0.4, and more preferably does not exceed 0.3, and more preferably does not exceed 0.2.

4) A combination of optical properties such that a suitably prepared diamond plate in the form of an etalon of a specified thickness of at least 0.5 mm, preferably at least 0.8 mm and more preferably at least 1.2 mm, and measured using a laser beam with a wavelength near 1.55 µm and a nominal diameter of 1.2 mm, over a specified area of at least 1.3 mm×1.3 mm, and preferably 2.5 mm×2.5 mm, and more preferably at least 4 mm×4 mm, exhibits a free spectral range (FSR) which, when measured at different positions over the plate varies by less than $5 \times 10^{-3}$ cm$^{-1}$, and preferably by less than $2 \times 10^{-3}$ cm$^{-1}$, and more preferably by less than $5 \times 10^{-4}$ cm$^{-1}$, and even more preferably by less than $2 \times 10^{-4}$ cm$^{-1}$.

5) A combination of optical properties such that a suitably prepared diamond plate in the form of a Fabry-Perot solid etalon of a specified thickness of at least 0.5 mm, preferably at least 0.8 mm and more preferably at least 1.2 mm, and measured using a laser beam with a wavelength near 1.55 µm and a nominal diameter of 1.2 mm, over a specified area of at least 1.3 mm×1.3 mm and preferably at least 2.5 mm×2.5 mm, and more preferably at least 4 mm×4 mm, and which has no coatings applied to the optically prepared surfaces, exhibits when measured at different positions over the plate a contrast ratio exceeding 1.5 and preferably exceeding 1.6 and more preferably exceeding 1.7 and even more preferably exceeding 1.8 and most preferably exceeding 1.9. The contrast ratio is defined as the ratio of the value of the etalon transmission at an incident laser wavelength near 1.55 µm where the transmission has a maximum value to the value of the etalon transmission at an incident laser wavelength near 1.55 µm where the transmission has a minimum value and the transmission value is defined as the ratio of the optical power of a laser beam that is transmitted through the etalon to the laser power that is incident on the etalon.

6) A combination of optical properties such that a suitably prepared diamond plate in the form of an etalon of a specified thickness of at least 0.5 mm, preferably at least 0.8 mm and more preferably at least 1.2 mm, and measured using a laser beam with a wavelength near 1.55 µm and a diameter of 1.2 mm, over a specified are of at least 1.3 mm×1.3 mm, and preferably at least 2.5 mm×2.5 mm, and more preferably at least 4 mm×4 mm, exhibits an insertion loss not exceeding 3 dB and preferably not exceeding 1 dB and more preferably not exceeding 0.5 dB and even more preferably not exceeding 0.3 dB.

7) Low and uniform optical absorption, such that a sample of a specified thickness of at least 0.5 mm, preferably at least 0.8 mm and more preferably at least 1.2 mm, has an optical absorption coefficient at a wavelength of 10.6 µm measured near 20° C. of less than 0.04 cm$^{-1}$, and preferably less than 0.03 cm$^{-1}$, and more preferably less than 0.027 cm$^{-1}$, and even more preferably less than 0.025 cm$^{-1}$.

8) Low and uniform optical absorption such that a sample of a specified thickness of at least 0.5 mm, preferably at least 0.8 mm and more preferably at least 1.2 mm, has an optical absorption coefficient at 1.06 µm of less than 0.09 cm$^{-1}$, and preferably less than 0.05 cm$^{-1}$, and more preferably less than 0.02 cm$^{-1}$, and even more preferably less than 0.01 cm$^{-1}$.

9) Low and uniform optical scatter, such that for a sample of a specified thickness of at least 0.5 mm, preferably at least 0.8 mm and more preferably at least 1.2 mm, and measured over a specified area of at least 1.3 mm×1.3 mm, and preferably at least 2.5 mm×2.5 mm, and more preferably at least 4 mm×4 mm, the forward scatter at a wavelength of 0.63 µm, integrated over a solid angle from 0.3° to 45° from the transmitted beam, is less than 0.2%, and preferably less than 0.1%, and more preferably less than 0.05%, and even more preferably less than 0.03%.

10) Low and uniform optical scatter, such that for a sample of a specified thickness of at least 0.5 mm, preferably at least 0.8 mm and more preferably at least 1.2 mm, and measured over a specified area of at least 1.3 mm×1.3 mm, and preferably at least 2.5 mm×2.5 mm, and more preferably at least 4 mm×4 mm, the forward scatter at a wavelength of 10.6 µm, integrated over the solid angle from 1.1° to 45° from the transmitted beam, is less than 0.004%, and preferably less than 0.002%, and more preferably less than 0.001%, and even more preferably less than 0.0005%.

11) A high laser damage threshold, such that at a wavelength of 10.6 µm using a Gaussian beam profile with a primary pulse spike of 50-100 ns and normalised to a 100 µm 1/e spot size, the mean of the lowest incident peak energy density that causes damage and the highest incident peak energy density that does not cause damage is greater than 120 Jcm$^{-2}$, and preferably greater than 220 Jcm$^{-2}$, and more preferably greater than 320 Jcm$^{-2}$, and even more preferably greater than 420 Jcm$^{-2}$.

12) A high laser damage threshold, such that at a wavelength of 1.06 µm using a Gaussian beam profile, with a primary pulse spike of 10-50 ns and more preferably 20-40 ns, and normalised to a 100 µm 1/e spot size, the mean of the lowest incident peak energy density that causes damage and the highest incident peak energy density that does not cause damage is greater than 35 Jcm$^{-2}$, and preferably greater than 50 Jcm$^{-2}$, and more preferably greater than 80 Jcm$^{-2}$, and even more preferably greater than 120 Jcm$^{-2}$, and even more preferably greater than 150 Jcm$^{-2}$.

13) High thermal conductivity, with a value for material composed of carbon in its natural isotopic abundance which when measured at 20° C. is greater than 1500 Wm$^{-1}$ preferably greater than 1800 Wm$^{-1}$K$^{-1}$, more preferably greater than 2100 Wm$^{-1}$K$^{-1}$, even more preferably greater than 2300 Wm$^{-1}$K$^{-1}$, and even more preferably greater than 2500 Wm$^{-1}$K. Those skilled in the art will understand that this is based on the diamond containing carbon isotopes in their natural abundance ratio, and that the figures will vary as the isotopic composition of the diamond varies.

14) An ability to be processed to show a high surface polish over a specified area of at least 1.3 mm×1.3 mm, and preferably at least 2.5 mm×2.5 mm, and more preferably at least 4.0 mm×4.0 mm, with an $R_a$ (arithmetic mean of the absolute deviation from the mean line through the profile) less than 2 nm, and preferably less than 1 nm, and more preferably less than 0.6 nm.

15) An ability to be processed to show a high parallelism, with a parallelism over a specified area of at least 1.3 mm×1.3 mm, and preferably at least 2.5 mm×2.5 mm, and more preferably at least 4.0 mm×4.0 mm, which is better than 1 arc minute, and preferably better than ±30 arc seconds, and more preferably better than ±15 arc seconds, and even more preferably better than ±5 arc seconds.

16) An ability to be processed to show a high flatness, with a flatness measured using 633 nm radiation over a specified area of at least 1.3 mm×1.3 mm, and preferably at least 2.5 mm×2.5 mm, and more preferably at least 4.0 mm×4.0 mm, which is better than 10 fringes, and preferably better than 1 fringe, and more preferably better than 0.3 fringes.

17) A mechanical design strength, obtained from measurements made using a single cantilever beam technique with individual sample dimensions of 5.0 mm by 3.0 mm by 0.17-0.35 mm (length by breadth by thickness), in which at least 70% and preferably at least 80%, and more preferably at least 90% of samples tested over a batch size of at least 8, and preferably at least 10, and more preferably at least 15, will only fail at strength values of at least of 2.5 GPa, and preferably of at least of 3.0 GPa, and more preferably of at least 3.5 Gpa.

18) A variation in refractive index over a volume of interest, said volume comprising a layer of a specified thickness of at least 0.5 mm, preferably at least 0.8 mm and more preferably at least 1.2 mm, and characterised by fabricating into one or more plates, which has a standard deviation in the refractive index which is less than 0.002, and preferably less than 0.001, and more preferably less than 0.0005, when measured at wavelengths near 1.55 µm over an area of at least 1.3 mm×1.3 mm, and preferably at least 2.5 mm×2.5 mm, and more preferably at least 4 mm×4 mm, by scanning the frequency of the laser beam incident on the sample in the form of an etalon over a frequency range of 197-192 THz, recording the transmission of the sample etalon as a function of frequency, and applying the formula for the Free Spectral Range (equation 1 defined later).

19) An effective refractive index in samples of a thickness of at least 0.5 mm, preferably at least 0.8 mm and more preferably at least 1.2 mm, and measured over a specified area of at least 1.3 mm×1.3 mm, and preferably at least 2.5 mm×2.5 mm, and more preferably at least 4 mm×4 mm, which has a value of 2.39695 to within an accuracy of +/−0.001, and more preferably to within an accuracy of +/−0.0005, when measured at wavelengths near 1.55 µm by scanning the frequency of the laser beam incident on the sample in the form of an etalon over the frequency range of 197-192 THz, recording the transmission of the sample etalon as a function of frequency, and applying the formula for the Free Spectral Range (equation 1 defined later). Those skilled in the art will understand that the value of 2.39695 is based on the diamond consisting of carbon isotopes in their natural abundance ratio, and that the value of 2.39695 will vary as the isotopic composition of the diamond varies.

20) Low and uniform optical scatter, such that for a sample of a specified thickness of at least 0.4 mm, preferably at least 0.8 mm and more preferably at least 1.2 mm thick, and measured over a specified area of at least 1.3 mm×1.3 mm, and preferably at least 2.5 mm×2.5 mm, and more preferably at least 4 mm×4 mm, the forward scatter at 1.064 µm measured by the method described herein, integrated over a solid angle from 3.5° to 87.5° from the transmitted beam, is less than 0.4%, and preferably less than 0.2%, and more preferably less than 0.1%, and even more preferably less than 0.05%.

21) Low luminescence under optical excitation at 514 nm, such that the Raman normalised intensity of either, and more preferably both, of the 575 nm photoluminescence (PL) line and the 637 nm PL line, is less than 40, and preferably less than 10 and more preferably less than 3 and more preferably less than 1.

22) Low optical birefringence, indicative of low strain such that in samples of a specified thickness of at least 0.5 mm, preferably at least 0.8 mm and more preferably at least 1.2 mm, measured over a specified area of at least 1.3 mm×1.3 mm, and preferably at least 2.5 mm×2.5 mm, and more preferably at least 4 mm×4 mm, the maximum value of $\Delta n_{[average]}$, the average value of the difference between the refractive index for light polarised parallel to the slow and fast axes averaged over the sample thickness, as measured by a Deltascan or similar instrument with similar resolution using radiation in the range 545-615 nm and preferably 589.6 nm does not exceed certain limits. Specifically, these limits are that for at least 98%, and more preferably for at least 99% and even more preferably for 100% of the analysed area of the sample, the birefringence remains in first order (δ does not exceed π/2) and that $\Delta n_{[average]}$ does not exceed $1.5\times10^{-4}$, and preferably does not exceed $5\times10^{-5}$, and more preferably does not exceed $2\times10^{-5}$, and more preferably does not exceed $1\times10^{-5}$.

The diamond material is preferably formed into a mechanical layer or an optical layer or polished gemstone, and more preferably an optical layer, and preferably exceeds one, more preferably two, and even more preferably three, of the following dimensions:
  a) a lateral dimension of 1 mm, preferably 2 mm, more preferably 5 mm and even more preferably 8 mm,
  b) a second orthogonal lateral dimension of 1 mm, preferably 2 mm, more preferably 5 mm and even more preferably 8 mm,
  c) a thickness of 0.1 mm, preferably 0.3 mm, more preferably 0.5 mm, and even more preferably 0.8 mm.

The invention extends to a single crystal CVD diamond material as described above for use in, or as, an optical device or element. Such device or element may be suitable for use in a wide range of optical applications, including, but not limited to, optical windows, laser windows, optical reflectors, optical refractors and gratings, and etalons. For applications requiring reflection at one or more surfaces such as beam splitters or etalons, the diamond may be used uncoated on these surfaces. In addition the material is advantageous as a polished gemstone, in which form it may be initially produced as a much thicker layer prior to polishing, typically 2.5 mm and more typically 3.5 mm thick or greater. Properties particularly applicable to this application include the uniformity of optical characteristics, the low scatter and absorption, and the ease of processing and the quality of the processed surface, which, particularly in combination, provides for a more brilliant stone.

The diamond material of the invention can be tailored to specific applications, and although it may not be endowed with all of the above properties in all cases, in many applications it is the ability of the diamond material to show a substantial set or particular combination of the above properties which makes its use particularly beneficial. For example, for use as an etalon, the material may require optical homogeneity, low absorption, high thermal conductivity, and the ability to be processed flat and parallel, but laser damage thresholds and mechanical strength may be less important. Conversely, in application as a viewing or optical access window, the strength may be important, as may be the scatter, the absorption, and characteristics affecting image quality.

An optical device which includes or comprises a CVD diamond material of the invention may have attached to it or built into it either a heat source or a temperature or other measuring device, or both. The heat source provides the ability to alter the temperature of the optical device, and thus any temperature dependent properties, and the temperature sensor a means by which to monitor this and in some instances provide feedback control. This technique is particularly applicable to diamond because its high thermal conductivity ensures the input heat is distributed uniformly very rapidly. Particular embodiments of this form of the invention may be the incorporation of doped layers or tracks using dopants such as boron to form the heater elements, and also further doped structures for the measurement of the temperature. Such doped structures could be produced by ion implantation or by other surface processing techniques.

The material may exhibit the beneficial properties after growth, after suitable shape and surface processing as required, or it may be processed by annealing to further enhance specific properties.

In application, the material may be further treated, such treatments including mountings, metallisations (such as for gratings), coatings (such as anti-reflection coatings), etching the surface to a specific topography (such as for diffractive optics), or the like.

According to another aspect of the invention, a method of producing a CVD diamond material suitable for optical applications comprises growing a single crystal diamond on a substrate with low crystal defect density by a CVD method in the presence of a controlled low level of nitrogen to control the development of crystal defects.

The level of nitrogen used in the method is selected to be sufficient to prevent or reduce local strain generating defects whilst being low enough to prevent or reduce deleterious absorptions and crystal quality degradation.

BRIEF DESCRIPTION OF THE DRAWINGS

The invention will now be described in more detail, by way of example only, with reference to the accompanying drawings in which:

FIG. 10 is a Deltascan map of a sample E4.1, showing the maximum value of |sin δ| in each frame of 1 mm×0.75 mm.

FIG. 11 is a Deltascan map of a sample E4.2, showing the maximum value of |sin δ| in each frame of 1 mm×0.75 mm.

FIG. 12 is a Deltascan map of a sample E4.3, showing the maximum value of |sin δ| in each frame of 1 mm×0.75 mm.

FIG. 13 is a Deltascan map of a sample E10.1, with the viewing direction parallel to a 1.31 mm dimension of the plate, showing the maximum value of |sin δ| in each frame of 1 mm×0.75 mm.

DESCRIPTION OF EMBODIMENTS

Figure 1:
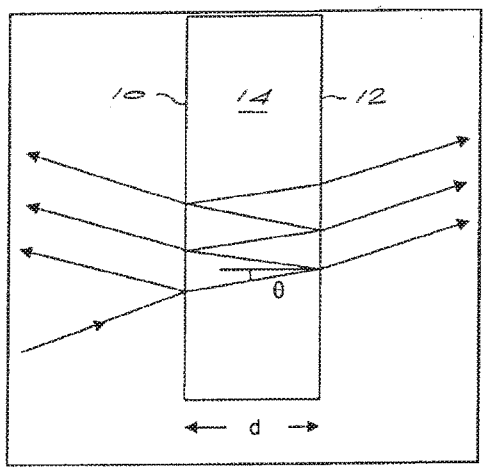
FIG. 1 is a schematic side view of a solid etalon showing a typical reflectance and transmittance pattern of a beam incident on a first surface thereof.

The CVD diamond material of the invention is produced by a CVD method in the presence of a controlled low level of nitrogen. The level of nitrogen utilised is critical in controlling the development of crystal defects and thus achieving a diamond material having the key characteristics of the invention. It has been found that material grown with high levels of nitrogen show deleterious absorptions. High levels of nitrogen may also degrade the crystal quality of the material. Conversely, material grown under conditions with essentially no nitrogen, or less than 300 ppb of nitrogen has a comparatively higher level of local strain generating defects, which affect directly or indirectly many of the high performance optical properties of the diamond. The exact mechanism of this is not well understood, but the following observations have been made. In what follows the word 'dislocations' is intended to cover both isolated dislocations and dislocation bundles where dislocations are grouped together.

No material can be made entirely free of dislocations and other crystal defects over large volumes. The sensitivity of different properties to such crystal defects varies. For example, the average refractive index is relatively insensitive, although local variations of this are quite sensitive. Engineering optical properties in CVD diamond, at the high level of precision required, appear to be extremely sensitive to dislocations.

The method of this invention is primarily applicable to growth on a {100} substrate face, and this is assumed unless otherwise stated, although the general method may be capable of growth of optical grade diamond on other specific substrate orientations.

In the absence of sufficient nitrogen in the gas mixture of the growth process, pits form on the {100} growth surface around dislocations which pre-exist in the substrate material or are generated at the substrate/growth interface. Whether because of these pits or otherwise, dislocations can slowly multiply during growth. To a certain extent this process is exponential, with the rate of dislocation multiplication dependent on the existing local dislocation density and arrangement.

In the presence of small amounts of nitrogen, relative facet growth rates are changed and these pits can be removed. Whether because of the absence of these pits or otherwise, dislocation multiplication can be reduced or totally avoided.

These pits may also be responsible for the inclusion of other defects and impurities in the material.

A further effect has been noted, which may form an important part of the process. At typical process conditions without nitrogen the epitaxial growth takes place with the progression of <110> surface steps moving across the substrate surface. These steps are typically just visible under a standard optical microscope, although their presence is generally best confirmed using Nomarski techniques or other high sensitivity techniques. Under the right conditions, increasing the nitrogen within the very low concentration levels of this invention, does not affect the morphology of these surface steps. With these steps present, the uptake of N into the diamond is generally low.

As the nitrogen level increases, the surface growth mechanism undergoes a transition. The surface steps of the diamond become more random and more generally centered around the <100> orientation, at least on a macroscopic scale, and the steps become larger and rougher. These steps are easily seen by microscope, and can often be seen by eye. In the presence of these steps nitrogen incorporation increases substantially and is generally non-uniform on a microscopic scale. The concentration of nitrogen at which this transition occurs is a sensitive function of the growth conditions, including temperature and pressure, but is typically around 1.8 ppm (of total gas concentration, when using $N_2$) for the processes described herein. For small excursions above this limit, some of the benefits of the method of the invention may still be realised, particularly for example the mechanical strength or the surface processing, but properties such as optical absorption are adversely affected by significant nitrogen incorporation, which easily occurs once <100> steps are present.

The lower bound to the concentration of N in the process gas is thus set by the need to limit pitting and control the strain generating defects, and the upper bound to the concentration of nitrogen in the process gas set by the onset of deleterious absorptions and other types of defect generation, and the role that the change in surface step growth mechanism has on these. However, these bounds are process dependent, such that they may vary according to the process conditions used, including the actual gaseous source of N, and also the specific material properties required, and are best illustrated by way of example. Typically however in the method of the invention, the upper bound on the nitrogen level in the gas phase (ppm $N_2$, or the equivalent of the actual nitrogen source used to provide the same total N) is 5 ppm, and preferably 2 ppm, and more preferably 1.5 ppm, and even more preferably 1 ppm. The lower bound on the nitrogen level in the gas phase (ppm $N_2$, or the equivalent of the actual nitrogen source used to provide the same total nitrogen) is greater than 300 ppb, and preferably greater than 500 ppb, and more preferably greater than 700 ppb, and even more preferably greater than 800 ppb.

The material can also be characterized in terms of the typical nitrogen concentration in the solid, although the relationship between this concentration and that of the nitrogen in the gas phase is a sensitive function of the detailed growth conditions. Typically the single substitutional nitrogen concentration as measured by electron paramagnetic resonance (EPR), exceeds $3 \times 10^{15}$ atoms/cm$^3$, and more typically exceeds $1 \times 10^{16}$ atoms/cm$^3$, and even more typically exceeds $5 \times 10^{16}$ atoms/cm$^3$. Furthermore, this concentration of the single substitutional nitrogen is typically less than $5 \times 10^{17}$ atoms/cm$^3$, and more typically is less than $2 \times 10^{17}$ atoms/cm$^3$.

Using the above conditions it has been possible to produce the single crystal CVD diamond material of the invention, typically in layer form, with advantageous optical properties.

It is important for the production of a diamond optical layer of the invention that growth of a layer of single crystal CVD diamond takes place on a diamond surface which is substantially free of crystal defects. In this context, defects primarily mean dislocations and micro cracks, but also include twin boundaries, point defects not intrinsically associated with the dopant N atoms, low angle boundaries and any other extended disruption to the crystal lattice. Preferably the substrate is a low birefringence type Ia natural, Ib or IIa high pressure/high temperature synthetic diamond or a CVD synthesised single crystal diamond.

The quality of growth on a substrate which is not substantially free of defects rapidly degrades as the layer grows thicker and the defect structures multiply, causing general crystal degradation, twinning and renucleation. Defects of this type are particularly deleterious to the present application, causing local variations in many of the key properties.

The defect density is most easily characterised by optical evaluation after using a plasma or chemical etch optimised to reveal the defects (referred to as a revealing plasma etch), using for example a brief plasma etch of the type described below. Two types of defects can be revealed:

1) Those intrinsic to the substrate material quality. In selected natural diamond the density of these defects can be as low as 50/mm$^2$ with more typical values being $10^2$/mm$^2$, whilst in others it can be $10^6$/mm$^2$ or greater.

2) Those resulting from polishing, including dislocation structures and microcracks forming chatter tracks along polishing lines. The density of these can vary considerably over a sample, with typical values ranging from about $10^2$/mm$^2$, up to more than $10^4$/mm$^2$ in poorly polished regions or samples.

The preferred low density of defects is such that the density of surface etch features related to defects, as described above, are below $5 \times 10^3$/mm$^2$, and more preferably below $10^2$/mm$^2$.

The defect level at and below the substrate surface on which the CVD growth takes place may thus be minimised by careful preparation of the substrate. Included here under preparation is any process applied to the material from mine recovery (in the case of natural diamond) or synthesis (in the case of synthetic material) as each stage can influence the defect density within the material at the plane which will ultimately form the substrate surface when preparation as a substrate is complete. Particular processing steps may include conventional diamond processes such as mechanical sawing, lapping and polishing (in this application specifically optimised for low defect levels), and less conventional techniques such as laser processing, reactive ion etching, ion beam milling or ion implantation and lift-off techniques, chemical/mechanical polishing, and both liquid chemical processing and plasma processing techniques. In addition, the surface $R_Q$ measured by stylus profilometer, preferably measured over 0.08 mm length) should be minimised, typical values prior to any plasma etch being no more than a few nanometers, i.e. less than 10 nanometers. $R_Q$ is the root mean square deviation of surface profile from flat (for a Gaussian distribution of surface heights, $R_Q$=1.25 $R_a$: for definitions, see for example "Tribology: Friction and Wear of Engineering Materials", IM Hutchings, (1992), Publ. Edward Arnold, ISBN 0-340-56184).

One specific method of minimising the surface damage of the substrate is to include an in situ plasma etch on the surface on which the homoepitaxial diamond growth is to occur. In principle this etch need not be in situ, nor immediately prior to the growth process, but the greatest benefit is achieved if it is in situ, because it avoids any risk of further physical damage or chemical contamination. An in situ etch is also generally most convenient when the growth process is also plasma based. The plasma etch can use similar conditions to the deposition or diamond growing process, but with the absence of any carbon containing source gas and generally at a slightly lower temperature to give better control of the etch rate. For example, it can consist of one or more of:

(i) an oxygen etch using predominantly hydrogen with optionally a small amount of Ar and a required small amount of $O_2$. Typical oxygen etch conditions are pressures of 50-450×10$^2$ Pa, an etching gas containing an oxygen content of 1 to 4 percent, an argon content of 0 to 30 percent and the balance hydrogen, all percentages being by volume, with a substrate temperature 600-1100° C. (more typically 800° C.) and a typical duration of 3-60 minutes.

(ii) a hydrogen etch which is similar to (i) but where the oxygen is absent.

(iii) alternative methods for the etch not solely based on argon, hydrogen and oxygen may be used, for example, those utilising halogens, other inert gases or nitrogen.

Typically the etch consists of an oxygen etch followed by a hydrogen etch and then moving directly into synthesis by the introduction of the carbon source gas. The etch time/temperature is selected to enable remaining surface damage from processing to be removed, and for any surface contaminants to be removed, but without forming a highly roughened surface and without etching extensively along extended defects such as dislocations which intersect the surface and thus cause deep pits. As the etch is aggressive, it is particularly important for this stage that the chamber design and material selection for its components be such that no material is transferred by the plasma from the chamber into the gas phase or to the substrate surface. The hydrogen etch following the oxygen etch is less specific to crystal defects rounding off the angularities caused by the oxygen etch which aggressively attacks such defects and providing a smoother, better surface for subsequent growth.

The primary surface of the diamond substrate on which the CVD diamond growth occurs is preferably the {100} surface. Due to processing constraints, the actual sample surface orientation can differ from this ideal orientation up to 5°, and in some cases up to 10°, although this is less desirable as it adversely affects reproducibility.

It is also important in the method of the invention that the impurity content of the environment in which the CVD growth takes place is properly controlled. More particularly, the diamond growth must take place in the presence of an atmosphere containing substantially no contaminants other than the intentionally added nitrogen. This addition of nitrogen should be accurately controlled, with an error of less than 300 parts per billion (as a molecular fraction of the total gas volume) or 10% of the target value in the gas phase, whichever is the larger, and preferably with an error of less than 200 parts per billion (as a molecular fraction of the total gas volume) or 6% of the target value in the gas phase, whichever is the larger, and more preferably with an error of less than 100 parts per billion (as a molecular fraction of the total gas volume) or 3% of the target value in the gas phase, and even more preferably with an error of less than 50 parts per billion (as a molecular fraction of the total gas volume) or 2% of the target value in the gas phase, whichever is the larger. Measurement of absolute and relative nitrogen concentration in the gas phase at concentrations in the range 300 ppb-5 ppm requires sophisticated monitoring equipment such as that which can be achieved, for example, by gas chromatography described in WO 01/96634.

The source gas may be any known in the art and will contain a carbon-containing material which dissociates producing radicals or other reactive species. The gas mixture will also generally contain gases suitable to provide hydrogen or a halogen in atomic form, and a source of nitrogen which may be for example $N_2$ or $NH_3$.

The dissociation of the source gas is preferably carried out using microwave energy in a reactor, examples of which are known in the art. However, the transfer of any impurities from the reactor should be minimised. A microwave system may be used to ensure that the plasma is placed away from all surfaces except the substrate surface on which diamond growth is to occur and its mount. Examples of preferred mount materials include molybdenum, tungsten, silicon and silicon carbide. Examples of preferred reactor chamber materials include stainless steel, aluminium, copper, gold and platinum.

A high plasma power density should be used, resulting from high microwave power (typically 3-60 kW, for substrate diameters of 25-300 mm) and high gas pressures (50-500×$10^2$ Pa, and preferably 100-450×$10^2$ Pa).

Specific properties of diamond may also be enhanced by annealing, and there is particular advantage in combining the technique of annealing with the diamond of the invention, to obtain the widest range of improved properties. By annealing is meant any process in which elevated temperature is used in a controlled manner to bring about a beneficial modification to any of the properties of diamond, either to those properties detailed in this specification or to properties which in application are complementary to those properties. The heat treatment will vary according to the nature of the as-grown CVD diamond and the desired changes to be produced. Properties of the diamond that are most sensitive to annealing include optical scatter and (low) luminescence, although other properties such as birefringence and mechanical design strength may also be improved. Annealing processes presumably further reduce local points of strain in the diamond as well as modifying regions of non-diamond structure. Annealing may be near atmospheric pressure or at high pressure and typically takes place in the temperature range above 1200° C. and more typically above 1700° C. An upper limit on the annealing temperature range of 2500° C.-2800° C. is set by the limitation of current experimental capabilities although benefit is anticipated from higher temperatures. Furthermore, annealing of CVD diamond in both the diamond and the graphite stable region has been shown to reduce the absorption centres in diamond, enhancing optical transmission, as described in co-pending international application PCT/IB03/03783, which can be of benefit.

A further important element is that annealing the diamond, and particularly the diamond of the invention, reduces the luminescence observed from the diamond under certain conditions. In particular, where the diamond is being used as an optical window, luminescence from the window can mask the irradiation which the window is intended to give access to. For example, where diamond is used as an anvil material which provides optical access to the sample under compression testing, luminescence from the anvil can be a severe limitation on the ability to study the optical characteristics of the material under compression. A particular non-limiting example is the luminescence from the 575 nm and 637 nm centres. CVD synthetic diamond grown with significant nitrogen concentrations in the starting gases or otherwise present in the process will show luminescence from nitrogen-vacancy centres. The neutral and negatively charged nitrogen-vacancy centres have zero-phonon lines at 575 nm and 637 nm, respectively. Luminescence from both of these centres may be excited with a 514 nm argon ion laser or other relatively short wavelength radiation sources, and if strong would be a significant disadvantage in using such single crystal CVD diamond in anvil applications. The intensity of nitrogen-vacancy luminescence can be significantly reduced by annealing treatment that dissociates the nitrogen-vacancy centres, for example by annealing at temperatures around and above 1800° C., using high pressure high temperature annealing for higher annealing temperatures. By way of example, it has been found that high pressure high temperature annealing at 1800° C. and 75 kBars for 24 hours can substantially reduce the luminescence at 575 nm and 637 nm.

Optical absorption at low levels is best measured by calorimetric means. Previous calorimetric measurements of optical absorption at 10.6 μm have been reported for polycrystalline CVD diamond layers (SE Coe et al, Diamond and Related Materials, Vol. 9, (2000) 1726-1729, and CSJ Pickles et al, Diamond and Related Materials, Vol. 9, (2000), 916-920). Typically absorption values at 10.6 μm in high quality optical grade polycrystalline diamond fall in the range of absorption coefficient $\alpha=0.03$ cm$^{-1}$-0.07 cm$^{-1}$, typical values being about 0.048 cm$^{-1}$. Measurement of natural diamond selected for low absorption is also reported to give a value of about 0.036 cm$^{-1}$. The similar lower limit seen in single crystal natural diamond and polycrystalline CVD diamond has been attributed to the tail of the two phonon absorptions in this region, and thus has been considered as a fundamental limit.

It is thus surprising that the diamond of this invention can exhibit a lower absorption coefficient of 0.0262 cm$^{-1}$, illustrating that even in natural diamond selected for low absorption there is a significant extrinsic absorption remaining at 10.6 µm which has not previously been recognized.

calorimetric measurements of diamond at 1.064 nm are less well reported than those at 10.6 µm, but a typical value for optical grade polycrystalline diamond is absorption coefficient α=0.119 cm$^{-1}$. In contrast, diamond made by the method of this invention has achieved values of α=0.0071 cm$^{-1}$. Such a low absorption coefficient makes this diamond particularly suited to high power laser applications and the like. This is particularly the case when the low beam distortion from the low strain in the material is also considered.

Applications arising from the CVD diamond material of the invention, where performance is enabled by these unique material properties, include but are not limited to:

optical windows—for example where very high image quality is required. The consistently high mechanical strength of the material assists in designing for applications where the window is pressurised.

laser windows—where high intensity beams need to pass undisturbed through a window providing a degree of isolation. It is particularly important that the laser beam does not interact with the window in a manner which degrades the beam, for example by local absorption and thermally induced strains, or cause sufficient energy to be absorbed for the window to be permanently damaged.

optical reflectors—where a surface needs to be extremely flat or have a very accurately prescribed surface shape and be stable.

optical refractors and lenses—where one or both surfaces of an optical transmission component are at least in part deliberately non planar or non parallel, but must be manufactured to great precision.

diffractive optical elements—e.g. where a structure in or on the diamond is used to modify a light beam by diffraction.

etalons.

ornamental use, such as in watch glasses, or as gemstones.

anvils for high pressure high temperature experiments—in this application the diamond may preferably be annealed.

For convenience, and by way of an example, the application of the diamond material of the invention to etalons will be described in detail, but those skilled in the art will recognise the general importance of the optical properties of the CVD diamond material of this invention to other applications such as those indicated above.

An optical system with two partially reflecting surfaces that has been fabricated in such a way as to have a high degree of flatness and parallelism between the two reflecting surfaces is called a Fabry-Perot Etalon. Typically the etalon can be made by aligning two very flat partially reflective mirrors such that their reflecting surfaces are parallel and separated by, for instance, an air or controlled gaseous medium gap or a vacuum separation. Alternatively the etalon can be made by polishing two very parallel surfaces 10,12 onto a plate 14 of an optically transparent solid material, called a solid etalon, as depicted schematically in FIG. 1 of the accompanying drawings.

Figure 2:
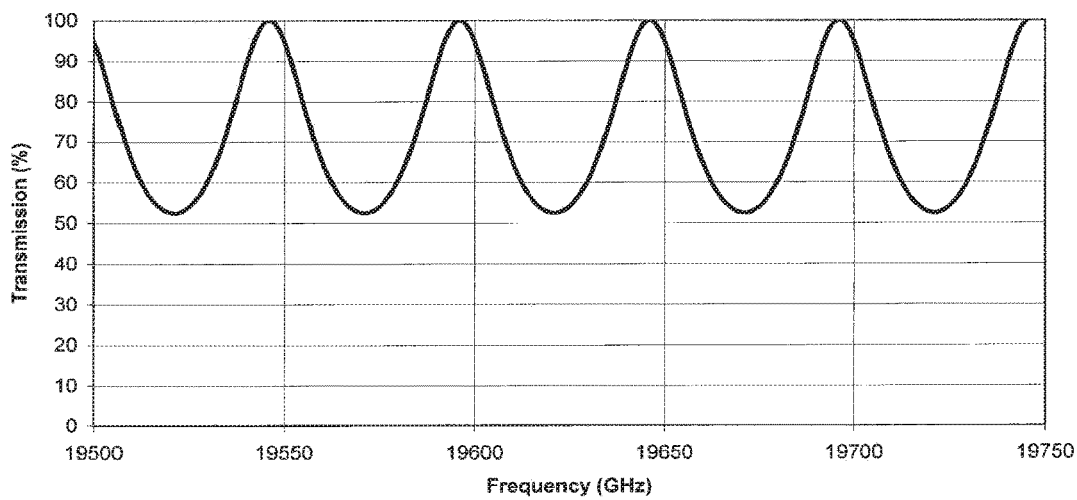
FIG. 2 is a graphical representation of a typical transmission characteristic of a solid etalon.

A beam incident on the first surface of the etalon is partially transmitted and reflected according to the reflectivity of the surface. The transmitted beam traverses the etalon and subsequently at the second surface is partially transmitted and partially reflected back to the first surface where again partial transmission and reflection take place. As a result interference takes place between transmitted and reflected parallel beams emerging from the etalon. A typical transmission characteristic from an etalon is shown graphically in FIG. 2.

The thickness of the etalon controls the separation of subsequent maxima/minima of the etalon characteristic, known as the free spectral range FSR, which for normally incident light is given below in terms of frequency, $$FSR = \frac{c}{2nd} \quad (1)$$

where c is the speed of light in vacuum, d is the thickness of the etalon, and n is the refractive index of the etalon material.

The shape of the transmission curve (e.g. the sharpness of the peaks and/or the depth of the minima) is further influenced by the reflectivity of the etalon surfaces. Different values of the reflectivity may be obtained by applying partially reflecting optical coatings to the etalon surfaces, as is well known in the art. Alternatively one can choose not to apply optical coatings to the etalon surfaces and use the Fresnel reflectivity of the uncoated surfaces of the etalon.

When the etalon transmission curve shows sharp peaks this may be characterised by the finesse, F, defined as the ratio of the (frequency) spacing between successive peaks over the full-width-half-maximum of the peaks. For high values of the reflectivity and when losses due to absorption or scatter in the etalon or at the reflecting surfaces and deviations from flatness and parallelism of the reflecting surfaces are so small they can be neglected, the finesse is given by:

$$F = \frac{\pi \sqrt{R}}{(1 - R)} \quad (2)$$

where R is the reflectivity of the etalon surface.

Alternatively, when transmission peaks are not very sharp, one can characterise the etalon transmission curve by specifying the contrast ratio, C. This is given by the ratio of the maximum and minimum transmission values, $$C = \frac{T_p}{T_v} \quad (3)$$

where $T_p$ ($T_v$) is the transmission of the etalon at a frequency equal to one of the peaks (valleys) in the transmission curve.

For etalons where deviations from flatness or parallelism, refractive index variations and absorption or scatter losses can be neglected, C is given by $$C = 1 + \frac{4R}{(1-R)^2} = \left(\frac{1+R}{1-R}\right)^2 \quad (4)$$

Another useful parameter to characterise the etalon performance is the insertion loss, L, expressed in decibel (dB), which is determined by the transmission of the etalon at the peaks, $$L = -10x^{10}\log(T_p) = -10x^{10}\log\left(\frac{I_p}{I_0}\right) \quad (5)$$

where $I_p$ and $I_0$ are the transmitted and incident intensities at a frequency equal to one of the peaks in the transmission curve. Thus defined the insertion loss can vary between 0 (no loss) and infinite (no transmission at all). For an ideal etalon without losses and with infinitely flat and parallel surfaces, the insertion loss would be 0.

When deviations from flatness or parallelism, refractive index variations or losses cannot be neglected, the approximate equations (2) and (4) are no longer valid and insertion loss (5) will tend to increase while the contrast ratio generally will be lower.

Figure 3:
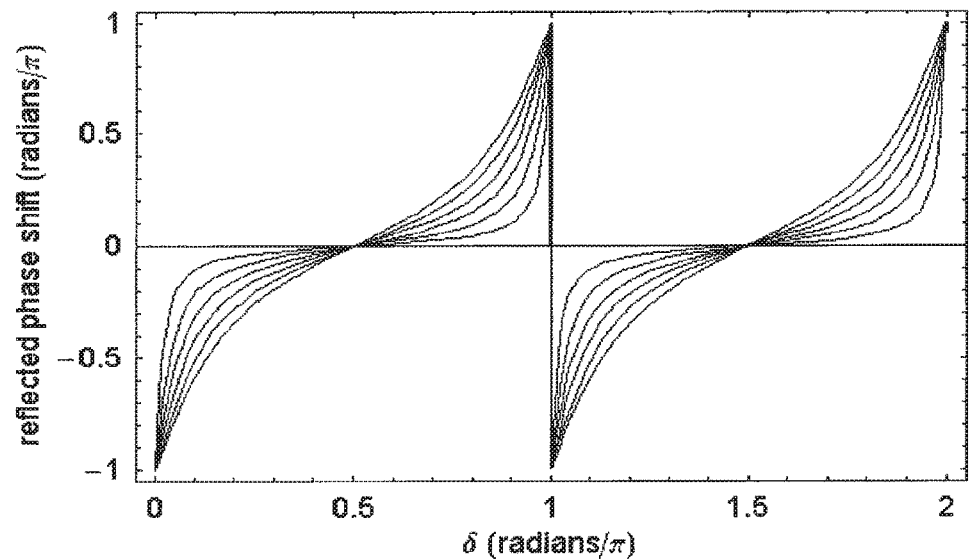
FIG. 3 is a graphical representation of a typical reflectivity characteristic of a Gires-Tournois etalon.

A variant of the Fabry-Perot etalon is the Gires-Tournois etalon which is essentially a Fabry-Perot etalon used in reflection with reflectivity of the back surface being 100%. The reflectivity of such an etalon is always 100%, independent of the wavelength of the incoming light but the phase of the reflected light is a periodic function of the incoming light frequency with a periods equal to that of the FSR, as defined in equation, of the Gires-Tournois etalon. This is shown in FIG. 3, where δ is defined as $$\delta = 4\pi\frac{nd}{c}f = 2\pi\frac{f}{FSR}$$

where f is the frequency.

The important material properties influencing etalon performance, expressed by the parameters free spectral range, insertion loss, contrast ratio and/or finesse, are thus:

R—surface reflectance (either intrinsic when uncoated or of the coating);
α—absorption losses in the bulk of the etalon material or at the surface;
$α_{sc}$—scatter losses in the bulk of the etalon material or at the surface;
n—refractive index of the etalon material and variations in it (including birefringence, i.e. dependence of the refractive index on polarisation and propagation direction in the material); and
d—flatness and parallelism of the reflecting surfaces.

Diamond has a number of advantages when used as an etalon compared with other materials, including:
a) a high refractive index, which translates into a more compact/thinner etalon;
b) a Fresnel reflectivity which in some applications is high enough so as to make optical coatings unnecessary;
c) a low temperature coefficient of refractive index and a low thermal expansion coefficient, which means that diamond etalons are less sensitive than some other optical materials to temperature changes;
d) a high thermal conductivity, which means that there is minimal variation in the transmission curve caused by temperature variations in the environment or absorption by the light beam (further increases in thermal conductivity are, however, beneficial for this reason);
e) the high strength and stiffness, relative to other materials, and high hardness of diamond, which makes it strong and impervious to scratching (if uncoated)—it also minimises the effects of any mounting induced stresses.

However, the use of diamond as an etalon material has been very limited. The limitation has been the availability of material with suitable properties, particularly those properties that are sensitive to the diamond quality, and in suitable sizes. For example, the most abundant natural diamond is type Ia. Type Ia natural diamonds are generally limited in size, and their price determined by their use as gemstones. Material available for commercial applications is mostly faint yellow coloured (absorbing), contains inclusions (stressed, scattering), and also contains hydrogen, which may give rise to further absorptions in the visible and infrared ranges of the spectrum. The refractive index variations between natural stones can be as high as 1%. Functionality in the intended application can only be assured by costly screening of each piece of material, which typically can only be performed after substantial processing has taken place.

The CVD diamond material of the invention provides a material, superior to other diamond and other materials, as an etalon material, such as in a Fabry-Perot etalon or a Gires-Tournois etalon.

The CVD single crystal diamond material of the invention, as described, has one or more key characteristics. Some of these characteristics and the techniques which may be used to measure or determine them will now be described.

Optical Characteristics and Measurement Techniques

Optical Homogeneity

The optical homogeneity was measured using a ZYGO GPI phase shifting 633 nm laser Fizeau-type interferometer. Samples were typically prepared as optical plates 0.8 and 1.25 mm thick and up to 5 mm×5 mm lateral dimensions with flat polished surfaces. Measurements were made using a 4% reflectivity flat, beam splitter and combining the reflected beam from this beam splitter with the transmitted beam after dual passage through the diamond plate with an intermediate reflection off a 10% reflective flat mirror. Both the beam splitter and the reflective mirror were of interferometric quality with flatness better than approximately 30 nm over their diameters of 100 mm. The resulting interference pattern was recorded with a charge coupled device (CCD) camera and digitally stored. The interference fringes were then analysed using the Transmitted Wavefront Measurement Application module which is supplied as standard software with the Zygo GPI interferometer. Deviations from a perfectly flat wavefront were thus recorded. These deviations are a combination of the effects of non-flatness of the surfaces and optical non-homogeneity of the diamond material. By polishing the surfaces to high enough flatness (better than 30 nm) the effects of the non-homogeneity could be determined to better than 0.05 fringe, proportionately lower levels of flatness being permissible for less accurate measurements.

Effective Refractive Index

The effective refractive index was measured by first measuring the thickness of an optical plate processed in the shape of an etalon with a digital micrometer with resolution better than 0.5 μm and then measuring the Free Spectral Range of the etalon over the frequency range of 197 THz-192 THz using light that is perpendicularly incident on the etalon, such that the required accuracy in the effective refractive index could be obtained. The effective refractive index was then found from equation (1) defined earlier. The effective refractive index found by this method can differ slightly from the refractive index found for example by simple application of Snell's law (refraction of light at the interface between two optical media), the value obtained here generally being higher. The difference arises because of the inevitable dispersion present in the diamond, and the fact that the method used here for the effective refractive index is a form of average obtained from the range of frequencies used in the measurement.

Free Spectral Range (FSR)

FSR was measured for a plate suitably processed in the form of an etalon (e.g. 1.5 mm×1.5 mm in the lateral dimensions and 1.25 mm thick, with peak-to-valley surface flatness better than 40 nm, as measured with a Zygo-NewView interferometer, using the flatness application included in the software of the Zygo-NewView interferometer, and parallelism of the polished surfaces better than 10 arcsec and surface roughness $R_a$ better than 1 nm). These plates were mounted on a optical stage with translational and rotational capability along two mutually perpendicular axes in the plane of the diamond etalon. The etalon was then positioned perpendicular to and centered with respect to a collimated beam from a laser diode whose wavelength can be continuously varied between 1.52 and 1.62 µm. The power transmitted through the etalon as a function of the frequency of the light was recorded and stored in digital form in a computer. From the frequency difference between successive peaks in the transmission spectrum the Free Spectral Range was directly determined.

Contrast Ratio and Insertion Loss

Contrast Ratio and Insertion Loss were measured for a plate suitably processed into the form from which discrete etalons can be cut (e.g. 4.0 mm×4.0 mm in the lateral dimensions and 1.25 mm thick), with peak-to-valley surface flatness better than 40 nm, as measured with a Zygo-NewView interferometer, using the flatness application included in the software of the Zygo-NewView interferometer, and parallelism of the polished surfaces better than 10 arcsec and surface roughness Ra better than 1 nm. These plates were mounted on an optical stage with translational and rotational capability along two mutually perpendicular axes in the plane of the diamond etalon. The plate was then positioned perpendicular to and centered with respect to a collimated beam from a laser diode whose wavelength can be continuously varied between 1.52 and 1.62 µm. The power transmitted through the plate as a function of the frequency of the light was recorded and stored in digital form in a computer. The contrast ratio of each etalon was determined by calculating the ratio of the measured maximum and minimum transmission at a frequency of about 197200 GHz.

Birefringence

For an isotropic medium, such as stress-free diamond, the refractive index is independent of the direction of the polarization of light. If a diamond sample is inhomogeneously stressed, either because of grown-in stress or local defects or because of externally applied pressure, the refractive index is anisotropic. The variation of the refractive index with direction of polarization may be represented by a surface called the optical indicatrix that has the general form of an ellipsoid. The difference between any two ellipsoid axes is the linear birefringence for light directed along the third. This may be expressed as a function involving the refractive index of the unstressed material, the stress and opto-elastic coefficients.

The Deltascan (Oxford Cryosystems) gives information on how the refractive index at a given wavelength depends on polarization direction in the plane perpendicular to the viewing direction. An explanation of how the Deltascan works is given by A. M. Glazer et al. in Proc. R. Soc. Lond. A (1996) 452, 2751-2765.

From a series of images captured for a range of different relative orientations of a pair of plane polarising filters the Deltascan determines the direction of the "slow axis", the polarization direction in the plane perpendicular to the viewing direction for which the refractive index is a maximum. It also measures $|\sin \delta|$ where $\delta$ is the phase shift given by $$\delta = (2\pi/\lambda) \Delta n L$$

where $\lambda$ is the wavelength of the light, L is the thickness of the specimen and $\Delta n$ is the difference between the refractive index for light polarized parallel to the slow and fast axes. $\Delta n\, L$ is known as the 'optical retardation'.

For retardation in first order, with L=0.6 mm and $\lambda$=589.6 nm, then:

when $\sin \delta = 1$ and $\Delta n\, L = \lambda/4$, it can be deduced that $\Delta n = 2.45 \times 10^{-4}$.

when $\sin \delta = 0.5$ and $\Delta n\, L = \lambda/12$, it can be deduced that $\Delta n = 0.819 \times 10^{-4}$.

The Deltascan produces three colour-coded images showing the spatial variations of a) the "slow axis", b) $\sin \delta$ and c) the absorbance at the wavelength of operation.

Samples are prepared as optical plates of known thickness and analysed over an area of at least 1.3 mm×1.3 mm, and preferably 2.5 mm×2.5 mm, and more preferably 4 mm×4 mm. Sets of Deltascan images or 'frames', each covering an area of 1 mm×0.75 mm, are recorded for each sample at a wavelength of 589.6 nm. Within each frame, the Deltascan individually analyses 640×480 pixels, ensuring the sample is analysed at very fine scale. The array of Deltascan $|\sin \delta|$ images is then analysed for the behaviour of sine $\delta$. The simplest analysis is to identify the maximum value of sine $\delta$ in each 1 mm×0.75 mm frame over the whole of the analysis area and use these values to characterise the maximum value of the whole of the area analysed. Where the array of 1 mm×0.75 mm frames does not exactly match the area under analysis, the frames are arranged to obtain the minimum total number of frames to entirely cover the area, and centred so as to make utilisation of edge frames as symmetric as practical. That part of the data in any frame which is from outside the boundary of the area under analysis is then excluded from the analysis of that frame. Alternatively, each 1 mm×0.75 mm frame can be analysed for the maximum value remaining after exclusion of 2%, or 1% of the data within it that lies within the analysed sample area, so as to obtain the maximum value over 98%, or 99% respectively of the material of the area analysed. This may be relevant where the application can tolerate a few isolated points of higher birefringence. However, in all the examples given in this specification all datapoints (100%) have been included in the analysis.

The behaviour of sine $\delta$ is the property of a particular plate of material, constrained here to plates of useful thickness by application of a minimum thickness. A more fundamental property of the material can be obtained by converting the sine $\delta$ information back to a value averaged over the thickness of the sample of the difference between the refractive index for light polarised parallel to the slow and fast axes, $\Delta n_{[average]}$.

Optical Absorption

Optical absorption is measured by laser calorimetry, with a thermocouple attached to the sample under test to measure the rise in sample temperature resulting from the passage through the sample of the laser beam of the required wavelength. Such techniques are well known in the art. In particular the methods used here conform to the International Standard ISO 11551:1997(E) and were made at 1.064 μm and 10.6 μm.

Optical Scatter

Methods for the measurement of optical scatter are well known (see for example DC Harris, "Infrared Window and Dome Materials", SPIE, Washington, USA 1992). However, in diamond pieces of small size (e.g. 4×4 mm laterally) and of the quality made possible by this method, it has been found necessary to develop a new technique for measuring scatter precisely.

Figure 4:
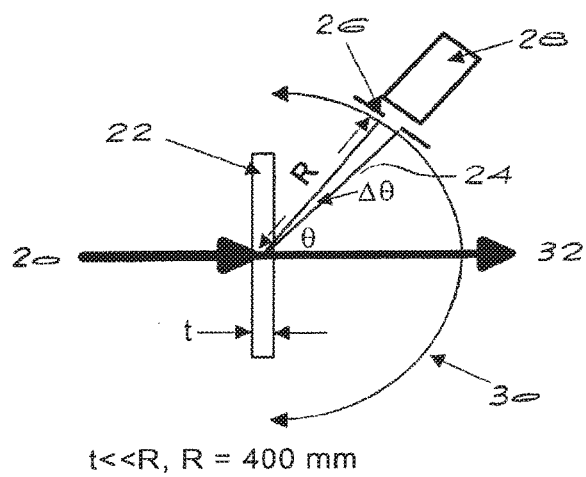
FIG. 4 is a diagrammatic representation of a system for measuring optical scatter at 1.06 µm in small diamond samples.

The new technique has been developed for measurement primarily at 1.06 μm, although other wavelengths such as 633 nm are possible. A diagram of the experimental set up for the method is shown in FIG. 4.

A 1.06 μm Nd-YAG laser 20 illuminates the sample 22 and the scattered beam 24 is detected through a defined aperture 26 with a highly linear, wide dynamic range detector 28. The sample 22 and detector 28 are mounted on separate goniometer stages (not shown) allowing precise movement of each. The whole system is in a class 100 "clean tent" (not shown) to minimise scatter by atmospheric dust and the clean tent itself is in a dark room to avoid stray light affecting the results.

The detector 28 is moved on an arc 30 from −85° to +85° in 5° steps, except in the region close to the through beam where movement is in 1° steps. Measurements are made with the incoming beam polarised either horizontally or vertically. The solid angle of the detector is 0.741 mSr. The goniometer stage for the diamond sample 22 allows it to be accurately aligned with respect to the incoming beam and then fixed for the duration of the experiment. The diagram of FIG. 4 is not to scale, with the distance between the sample and the detector being 400 mm. The unscattered beam is indicated by reference numeral 32.

Figure 5:
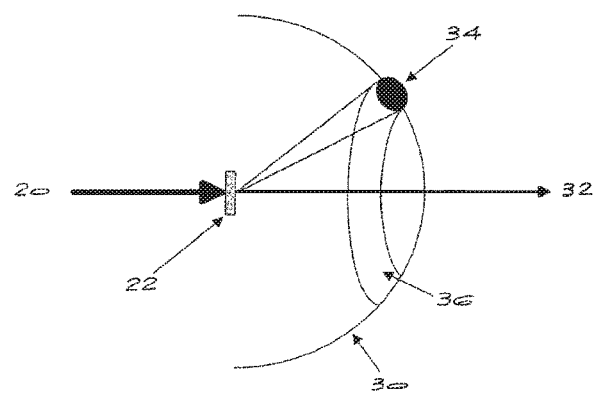
FIG. 5 is a diagrammatic representation of the conversion of one-dimensional data obtained from the system of FIG. 4 into two-dimensional data.

The data from the detector is gathered in a series of discrete steps and therefore represents a histogram of the scatter as a function of angle, measured over the restricted solid angle of the detector. This data is converted from essentially a one-dimensional array covering a strip from a hemisphere into two-dimensional data covering bands around a hemisphere. This is illustrated in FIG. 5, where 34 is the scattered beam as measured and 36 is the converted data to give the total intensity scatter at this angle, as described more fully below.

The data gathered is defined as the fractional scattered power per unit solid angle at angle θ ("FSP(θ)"):

$$\frac{P_{m,\theta}}{P_i \Omega} Sr^{-1} \text{ at angle } \theta$$

where $P_{m,\theta}$ is the measured power at the detector at angle θ, $P_i$ is the incident beam power and Ω is the solid angle of the detector.

Light scattered by angle θ goes into a band with circumference $2\pi R \sin \theta$, height $R\Delta\theta$ and therefore area, $A_r = \pi R \sin \theta \cdot R\Delta\theta$.

The solid angle of the band, $\Delta\Omega_r$, is given by $$\Delta\Omega_r = \frac{A_r}{R^2} = 2\pi \sin\theta \Delta\theta$$

From this, the total scattered power, TSP, the value we require is given by:

$$TSP = \int_0^{\pi/2} FSP(\theta) \cdot \Delta\Omega_r$$

However, the data is discrete rather than continuous so the TSP must be calculated by a summation rather than an integration operation:

$$TSP = \sum_0^{\pi/2} \left(\frac{vp + hp}{2}\right)_\theta 2\pi \sin\theta \Delta\theta$$

in which vp and hp are the vertically and horizontally polarised data and ΔΘ is the data interval radians. Care has to be taken with the data interval as this varies, being 1° at low angles and 5° for angles more than 5° from the unscattered beam.

Laser Damage Threshold

The laser damage threshold is measured by firing pulses of a laser at the sample under test, and characterising the point of failure as the mean of the lowest incident peak energy that causes damage and the highest incident peak energy that does not cause damage.

At a wavelength of 10.6 μm a $CO_2$ laser was used with a primary spike of the order of 50-100 ns containing typically ⅓ of the total pulse energy, and a much lower peak power relaxation pulse of the order of 2 μs. at a obtained was normalised to a 100 μm 1/e spot size. The relaxation pulse can be neglected because this test operates in the time domain where electron avalanche ionisation is the conventional model for damage to occur, which is thus dependent on peak power density (i.e. peak electric field).

At a wavelength of 1.06 μm a Nd:YAG laser was used with a single spike of 10-50 ns duration, and more preferably in the range 20-40 ns, with data again normalised to a 100 μm 1/e spot size.

Thermal Conductivity

Thermal conductivity is measured by the laser flash technique (see for example DJ Twitchen et al., Diamond and Related Materials, 10 (2001) p 731, and CJH Wort et al, Diamond and Related Materials, 3 (1994) p 1158).

Surface Roughness

Surface roughness was measured using a Zygo NewView 5000 scanning white light interferometer. The interferometer utilises a microscope equipped with an interferometric objective of the Michelson or the Mireau type. Magnifications of between 1× to 50× are possible with this system. By measuring over the full area of the diamond plate we found that surface roughness varied by less than 10% over the area of the plate if it was fully fine-polished. Therefore in the current measurements the roughness was inferred from measurement over a representative area of approx. 0.36 mm×0.27 mm.

Surface Parallelism

Surface parallelism was measured using a Zygo GPI phase shifting 633 nm laser Fizeau-type interferometer in a set-up identical to the measurement of the transmitted wavefront. By comparing the transmitted wavefront fringe pattern with the diamond etalon in the beam path with the pattern measured without an etalon in the beam path, the change in direction of and distance between successive fringes was computed and from this the deviation from parallelism between the two polished surfaces of the etalon was determined. These two fringe patterns were measured simultaneously by passing part of the light through the etalon while at some other position the light was directly incident on the 10% reflective flat mirror and was again reflected back towards the detector without passing through the diamond etalon. The simultaneous measurement allowed for higher accuracy than if the two measurements were performed one after the other.

Surface Flatness

Surface flatness was measured using a Zygo GPI phase shifting 633 nm laser Fizeau-type interferometer. With this interferometer the light from a 633 nm laser source was partially reflected from a 10% reflectivity, interferometric quality beam splitter and the light transmitted by the beam splitter was partially reflected by the polished surface of a diamond optical component manufactured from the material of the invention. The two reflected beams were combined and the resulting fringe pattern was recorded with a CCD camera detector and stored digitally in a computer. The pattern was subsequently analysed with the flatness application which is included as a standard application in the software of the Zygo GPI interferometer.

Mechanical Strength

The utility of the material of this invention is clearly illustrated by the absence of reported strength data in single crystal diamond which has been obtained by actual fracture tests. Data currently reported are based on indentation tests, and the approximations and assumptions which are inherent in this approach. Conversely, the method of this invention makes material available in sufficient quantity that proper fracture tests can be completed.

Furthermore, fracture strength testing is a destructive test. Since each piece of natural diamond is unique, once its strength is known then it is no longer available for application. Fracture testing can then only be used to characterise the spread of strength against some proxy characteristic, and the lowest anticipated strength used for application. In contrast, the synthetic diamond of the invention is a well characterised and consistent material such that the fracture strength of a particular element can be reasonably predicted based on fracture statistics of equivalent samples. The design strength of diamond, as used in this specification, is the strength which is exhibited by at least 70%, preferably 80%, and more preferably at least 90% of equivalent samples of material tested using the procedure below.

The strength was measured using a single cantilever beam technique, with a sample size of 5.0 mm by 3.0 mm by 0.18-0.35 mm (length, l, by breadth, b, by thickness, d). The samples were cut from {100} oriented plates, with the long axis along the <110> direction (so that the thickness is along the <100> and the length and breadth are along the <110>). The testing procedure mounted the beams with an exposed length of 4 mm (i.e. 1 mm inside the clamp) and applied the force at a distance of 3.5 mm from the clamp.

The strength, $\sigma_b$, is given by the expression:

$$\sigma_b = (6Ws)/(bd^2)$$

where W is the breaking load and s is the distance between the loading line and the clamping line.

Test samples were cut from homoepitaxial CVD diamond plates and carefully prepared by scaife polishing on progressively finer and finer grits down to a grit size of approximately 0.1 µm. Poor surface finish can limit the measured strength of the material and the ability of this material to take a high surface finish may contribute to its overall strength.

Luminescence

Quantitative luminescence properties of diamond samples can be obtained by normalising the integrated intensities of the relevant luminescence lines or bands relative to the integrated intensity of the diamond Raman scattering collection under the same conditions. The measurements are made at 77K with a 300 mW 514 nm argon ion laser beam and spectra recorded using a Spex 1404 spectrometer equipped with a holographic grating (1800 grooves/mm) and a Hamamatsu R928 photomultiplier. The data is corrected to allow for spectral response function of the spectrometer system, derived using a standard lamp with a known spectral output.

The invention will now be discussed in further detail by way of the following non-limiting examples.

Example 1

Substrates suitable for synthesising single crystal CVD diamond of the invention may be prepared as follows:
i) Selection of stock material (type Ia natural stones and type Ib HPHT stones) was optimised on the basis of microscopic investigation and birefringence imaging to identify substrates which were free of strain and imperfections.
ii) Laser sawing, lapping and polishing to minimise subsurface defects using a method of a revealing plasma etch to determine the defect levels being introduced by the processing.
iii) After optimisation it was possible routinely to produce substrates in which the density of defects measurable after a revealing etch is dependent primarily on the material quality and is below $5 \times 10^3/mm^2$, and generally below $10^2/mm^2$. Substrates prepared by this process are then used for the subsequent synthesis.

A high temperature/high pressure synthetic type 1 b diamond was grown in a high pressure press, and as a substrate using the method described above to minimise substrate defects to form a polished plate 5 mm×5 mm square by 500 µm thick, with all faces {100}. The surface roughness $R_Q$ at this stage was less than 1 nm. The substrate was mounted on a tungsten substrate using a high temperature diamond braze. This was introduced into a reactor and an etch and growth cycle commenced as described above, and more particularly:
1) The 2.45 GHz reactor was pre-fitted with point of use purifiers, reducing unintentional contaminant species in the incoming gas stream to below 80 ppb.
2) An in situ oxygen plasma etch was performed using 15/75/600 sccm (standard cubic centimeter per second) of $O_2/Ar/H_2$ at $263 \times 10^2$ Pa and a substrate temperature of 730° C.
3) This moved without interruption into a hydrogen etch with the removal of the $O_2$ from the gas flow.
4) This moved into the growth process by the addition of the carbon source (in this case $CH_4$) and dopant gases. In this instance was $CH_4$ flowing at 36 sccm and 1 ppm $N_2$ was present in the process gas, provided from a calibrated source of 100 ppm $N_2$ in $H_2$ to simplify control. The substrate temperature at this stage was 800° C.
5) On completion of the growth period, the substrate was removed from the reactor and the CVD diamond layer removed from the substrate.

The CVD diamond layer grown above can be sufficiently large to produce at least one and preferably several diamond etalons (in a two dimensional array) depending on the size of the CVD diamond layer and the required size of the etalons and sufficiently thick to prepare at least one and preferably more CVD diamond plates for processing After removal from the substrate the diamond layer grown as described above was sawn into a number of diamond plates (if required) and each diamond plate was subsequently polished to just above the desired thickness of 1.25 mm, which is the thickness of the desired diamond etalon as defined by the required free spectral range and intended wavelength of operation, using polishing techniques known in the art.

The plate was then fine polished one side on a cast iron diamond polishing wheel that had been carefully prepared. The tang used was very rigid and held the diamond against a reference surface that ran parallel to the scaife surface.

The diamond plate was then turned over and the other side was polished to the desired flatness and parallelism on the same scaife, taking care at this stage to bring the thickness to that required for the final etalon. Parallelism was measured using a commercial Zygo GPI interferometric instrument based on the Fizeau principle, well known to those skilled in the art. The thickness was measured initially by a micrometer, using measurement of the free spectral range (FSR) as a final stage check. Final thickness was achieved by measuring the linear removal rate, which because of the quality of the material was very constant, and then polishing for the necessary predicted time. Other methods of etching or material removal have been used, including ion beam etching, plasma etching or reactive ion etching.

The plate was then cut up by a laser into discrete units. The side faces were then polished, although this is not always required by the application.

The resultant diamond etalon was 1.5 mm square, 1.251 mm thick, made to the following tolerances:
thickness:—±0.25 µm
parallelism—: ±5 arcsec
surface $R_a$:—0.5 nm
and had a FSR of $1.6678 \pm 2 \times 10^{-4}$ cm$^{-1}$.

Another diamond plate from the above synthesis process was used to further characterise the achievable surface $R_a$. The surface was carefully polished on both sides as described above and then measured for surface $R_a$ using the Zygo NewView 5000 scanning white light interferometer. Measurements were taken each side of the sample, each measurement on a 1 mm×1 mm area with the 9 areas forming a 3 mm×3 mm grid on the centre of each side, and then the statistical mean of the 9 measurements was calculated. The measured $R_a$ on side A was 0.53 nm±0.04 nm, and on side B was 0.54 nm±0.05 nm.

Example 2

A set of 6 mm×6 mm×0.4 mm plates of homoepitaxial CVD diamond were synthesised according to the method described in Example 1. From these plates, a set of rectangular test samples, 3 mm×5 mm in lateral dimensions and 0.17 to 0.22 mm thick were cut, ensuring that the cut pieces were free from growth sector boundaries.

The set of samples was polished on a scaife using a range of diamond powders down to 0.1 µm. Care was taken to ensure that, as far as possible, all sub-surface damage was removed from the samples. The final polishing stage with the finest grit is vital as this controls the final surface flaw size distribution. After the top and bottom surfaces were polished, the edges of the samples were prepared to the same standard. After polishing was complete, the surfaces were examined by Nomarski interference contrast and 'micro-mapped' to check the surface roughness. Nomarski microscopy at a magnification of ×200 revealed that there where no visible defects in the surface. The surface roughness, as defined by the $R_a$ value, was determined using a non-contact, optical surface roughness measurement instrument ('Micromap'). Two series of 200 µm long scans were made in perpendicular directions and the resulting $R_a$ values were averaged yielding a mean $R_a$ value of less than 0.25 nm. This compares with typical $R_a$ values of between 1 nm and 5 nm for diamonds polished using the same technique as is used for polishing natural diamonds in the jewelry trade.

An additional stage of ion beam etching was applied to the surface of some of the samples prior to final polishing. A further optional technique would be to chemically thin the samples prior to final polishing.

The strength of the plates was measured by single cantilever beam bending. The individual strength values for a set of nine samples approximately 0.2 mm thick were, in GPa, 1.50, 1.63, 2.50, 3.26, 3.30, 4.15, 4.29, 4.83, 5.12. Analysis of this and other datasets suggests that the two lowest values are from a different population to the other seven, possibly indicating that the sample preparation was not sufficiently careful in this instance to avoid any influence on the measured strength. Even with these two suspect data points included, 77% of samples have a breaking strength of at least 2.5 GPa, and the data suggests the strength is actually in excess of 3 GPa.

For comparison, there being no equivalent data in the public domain (all known strength measurements on natural diamond are based on indentation testing, which is an indirect and less reliable method, because of the restricted availability of suitable samples), the strength of a batch of five type IIa natural diamond plates was also measured. These plates were carefully selected by examination with an optical microscope at ×50 magnification to be free of inclusions and other flaws which may weaken the diamond, and were prepared and tested by the same technique. The individual strength values for this set of 5 samples approximately 0.18 mm thick were, in GPa, 1.98, 2.08, 2.23, 2.61, 2.94 clearly limited by the intrinsic properties of the material. Similarly type Ib single crystal diamond synthesised by a high pressure-high temperature process were carefully selected, processed, and tested using the same techniques. The individual strength values for this set of 14 samples approximately 0.35 mm thick were, in GPa, 0.94, 1.11, 1.16, 1.3, 1.35, 1.38, 1.46, 1.50, 1.54, 1.6, 1.65, 1.72, 1.73, 1.98, 2.17.

The strength population of the CVD diamond of this invention is clearly distinct and higher than that of either the natural or HPHT diamond.

A particular application of high strength diamond is in optical windows for gas analysis by infrared spectroscopy. A particular window, which is 7 mm in diameter, has a clear aperture of 5 mm and is brazed around the outer 1 mm of one flat surface, has to withstand a pressure differential of 200 atmosphere with a safety factor of 4.

The breaking strength is related to the thickness, t, by:

$$t=\sqrt{(3r^2 Pk/8\sigma_b)}$$

where r is the clear aperture, P, the pressure, $\sigma_b$, the breaking strength and k a constraint factor which, for diamond, is 3.1 for unconstrained at the edge and 1.1 for fully constrained at the edge (assuming Poissons ratio for diamond to have a value of 0.1). Because determining the degree of constraint is difficult, we take the worst-case scenario of the edge being unconstrained.

If a natural diamond window (design strength 2.0 MPa) were used in this application, the thickness would need to be 0.54 mm. With strong single crystal CVD diamond of the invention (design strength 3.0 MPa), the thickness could be reduced to 0.44 mm. The reduction in the thickness of the material will reduce the cost of the window.

Example 3

A set of 3 plates of homoepitaxial CVD diamond were synthesised according to the method described in Example 1. These were prepared as optical plates of thickness 0.60-0.64 mm and with lateral dimensions of up to 6 mm×6 mm. Sets of Deltascan images, each covering an area of 1 mm×0.75 mm, were recorded for each sample at a wavelength of 589.6 nm.

Each Deltascan sine δ image was analysed for the maximum value of |sin δ| using 100% of the data and theses maximum values are shown in the |sin δ| maps of FIGS. 10-12.

FIG. 10 is the Deltascan map of sample E4.1, showing the maximum value of |sin δ| in each frame of 1 mm×0.75 mm.

Analysis of the data of FIG. 10 shows the following
over an area of 2.0 mm×2.25 mm the maximum value for |sin δ| is 0.3
over an area of 3.0 mm×4.0 mm the maximum value for |sin δ| is 0.6
over an area of 5.25 mm×4.0 mm the maximum value for |sin δ| is 0.9

FIG. 11 is the Deltascan map of sample E4.2, showing the maximum value of |sin δ| in each frame of 1 mm×0.75 mm.

Analysis of the data of FIG. 11 shows the following
over an area of 2.0 mm×3.75 mm the maximum value for |sin δ| is 0.3
over an area of 3.0 mm×3.75 mm the maximum value for |sin δ| is 0.4
over an area of 4.0 mm×4.5 mm the maximum value for |sin δ| is 0.7

FIG. 12 is the Deltascan map of sample E4.3, showing the maximum value of |sin δ| in each frame of 1 mm×0.75 mm.

Analysis of the data of FIG. 12 shows the following
over an area of 3.0 mm×2.25 mm the maximum value for |sin δ| is 0.2
over an area of 3.75 mm×3.0 mm the maximum value for |sin δ| is 0.6
over an area of 4.0 mm×4.5 mm the maximum value for |sin δ| is 0.9

Example 4

8 sets of homoepitaxial CVD diamond layers were synthesised according to the method described in Example 1. The CVD diamond layers had lateral dimensions of up to 6.5 mm and thicknesses of up to 3.2 mm. From these CVD diamond layers a total of 48 plates were prepared as etalon plates with lateral dimensions of typically 4.0×4.0 mm and thicknesses of approximately 1.25 mm. The thickness of each plate was measured with a micrometer to an accuracy of better than ±0.25 μm.

The average FSR of each plate over the C-band (197200-192200 GHz) was determined by measuring the frequencies of the peak position of the etalon transmission peak nearest to the start and end position of the C-band for perpendicular incident light. A 1 mm diameter beam was used. These peak positions could be determined to an accuracy better than ±0.5 GHz. The effective FSR is calculated by dividing the frequency interval between the two extreme peaks by the number of periods in the transmission spectrum (For this etalon thickness and frequency band typically 100 periods). Thus the error in the determination of the FSR is better than ±10 MHz.

Figure 6:
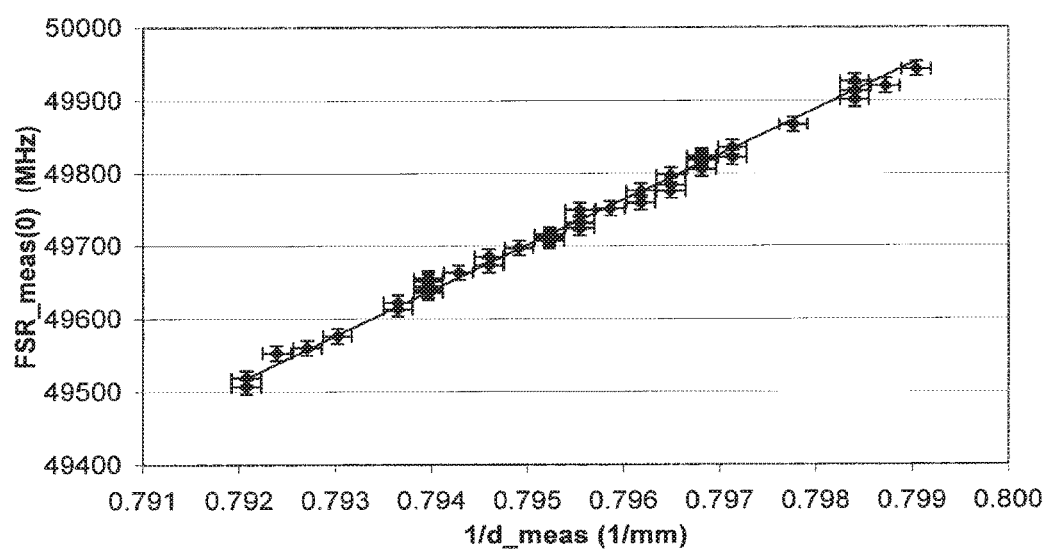
FIG. 6 is a graphical representation of the measurement made of FSR as a function of the inverse of the sample thickness for diamond samples as described in Example 4.

FIG. 6 shows the measured FSR as a function of the inverse of the sample thickness for each of the plates. From the slope of the least-square straight line fit to the data an effective refractive index was calculated using equation (1) which gave a value for the average effective refractive index of:

$n_{eff,av} = 2.39695$ with a standard deviation of $\sigma_n = 0.00045$

The maximum deviation from the average was:

$\Delta n_{max} = \pm 0.00092$

The maximum relative measured deviation is therefore found to be:

$$\frac{\Delta n_{max}}{n_{eff,av}} = \pm 3.84 \times 10^{-4}$$

This measured deviation is due to measurement errors in thickness d and FSR and due to the variation in the refractive index from sample to sample due to material inhomogeneity, $\Delta n_{inhom}$ $$\frac{\Delta n_{max}}{n_{eff,av}} = \left(\frac{\Delta n}{n}\right)_{meas} + \left(\frac{\Delta n_{inhom}}{n}\right)$$

Error analysis shows that the maximum relative measurement error in n due to the measurement errors in thickness d and FSR is:

$$\left(\frac{\Delta n}{n}\right)_{meas} = \frac{\Delta d}{d} + \frac{\Delta FSR}{FSR} = \frac{0.25 \, \mu m}{1.255 \, mm} + \frac{10 \, MHz}{50 \, GHz} = \pm 4.0 \times 10^{-4}$$

The maximum relative deviation $\Delta n_{max}/n_{eff,av}$ is largely determined by the measurement error in thickness ($\Delta d$) and FSR ($\Delta FSR$).

An upper limit on the variation in the value of the refractive index, $\Delta n_{inhom}/n$, is therefore at least better than $\pm 4 \times 10^{-4}$.

Example 5

8 sets of homoepitaxial CVD diamond layers were synthesised according to the method described in Example 1. The CVD diamond layers had lateral dimensions of up to 6.5 mm and thicknesses of up to 3.2 mm. From these CVD diamond layers a total of 48 plates were prepared as etalon plates with lateral dimensions of typically 4.0×4.0 mm and thicknesses of approximately 1.25 mm.

Figure 7:
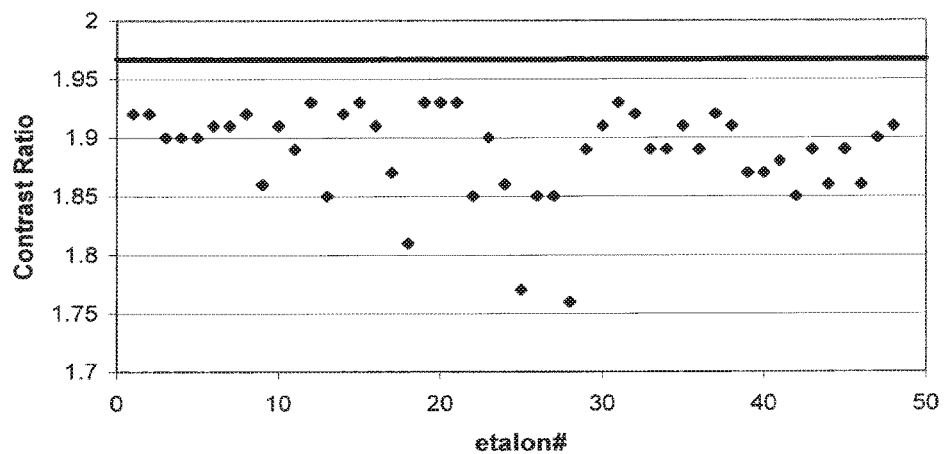
FIG. 7 is a graphical representation of the contrast ratios of tested etalon plates of the invention as described in Example 5.

The contrast ratio of each etalon plate was determined as described earlier and the results are plotted in FIG. 7, where the solid line indicates the theoretically maximum value for an ideal etalon, for which the surface reflectivity is determined by the refractive index $$C_{th} = \left(\frac{1+R}{1-R}\right)^2, R = \left(\frac{n-1}{n+1}\right)^2$$

(Note that here the effective refractive index is not the correct value to use, but that the actual refractive index at the considered frequency is to be used which has the value n=2.3856, as can be determined from the Sellmeier equation, describing the dispersion of the refractive index. This value is consistent with the measured value of the effective refractive index.) The theoretical value of the contrast ratio is:

$C_{th}=1.967$

The average measured contrast ratio is:

$C_{meas,av}=1.89$ with a standard deviation:

$\sigma_c=\pm 0.04$

Any imperfection in etalon material properties (inhomogeneities in the volume) and etalon preparation (imperfect parallelism, flatness, roughness of the surfaces) reduces the contrast ratio. The consistently high value of the contrast ratio demonstrates the homogeneity of the material properties and the accuracy of the etalon preparation.

Example 6

8 sets of homoepitaxial CVD diamond layers were synthesised according to the method described in Example 1. The CVD diamond layers had lateral dimensions of up to 6.5 mm and thicknesses of up to 3.2 mm. From these CVD diamond layers a total of 48 plates were prepared as etalon plates with lateral dimensions of typically 4.0×4.0 mm and thicknesses of approximately 1.25 mm.

The parallelism of 9 etalon plates were measured using a Zygo GPI phase shifting 633 nm laser Fizeau-type interferometer, using the angle application included in the software of the Zygo-GPI interferometer.

Parallelism is calculated from the angle of the least-squares fitted plane to the wavefront of the beam transmitted through the etalon with respect to the plane wavefront of the unperturbed beam. This defines a wedge angle between the front and backside of the etalon The average wedge angle α varied between 2.3 and 13.8 arcsec with an average value of:

$\alpha_{av}=9.2$ arcsec and a standard deviation of:

$\sigma_\alpha=3.5$ arcsec

Example 7

8 sets of homoepitaxial CVD diamond layers were synthesised according to the method described in Example 1. The CVD diamond layers had lateral dimensions of up to 6.5 mm and thicknesses of up to 3.2 mm. From these CVD diamond layers a total of 48 plates were prepared as etalon plates with lateral dimensions of typically 4.0×4.0 mm and thicknesses of approximately 1.25 mm.

Surface flatness over one surface of each of the 48 etalon plates was measured using a Zygo GPI phase shifting 633 nm laser Fizeau-type interferometer, using the flatness application included in the software of the Zygo-GPI interferometer.

Figure 8:
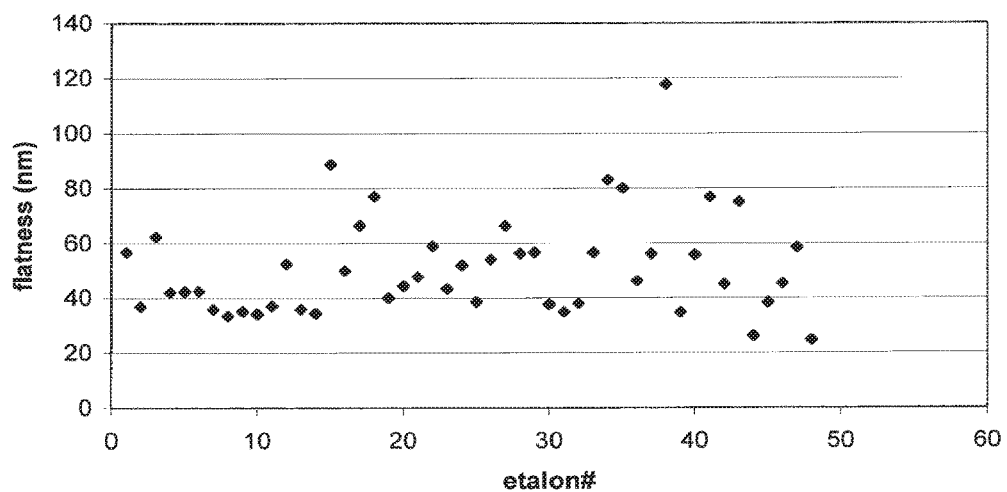
FIG. 8 is a graphical representation of measured surface flatness values of tested etalon plates of the invention as described in Example 7.

In this application the flatness is defined as the largest peak-valley difference, after fitting a plane to the measurement data. FIG. 8 shows the measured surface flatness values.

The average surface flatness F is:

$F=51.1$ nm, or 0.16 fringes and the standard deviation is $\sigma_F=18.2$ nm, or 0.058 fringes Example 8

8 sets of homoepitaxial CVD diamond layers were synthesised according to the method described in Example 1. The CVD diamond layers had lateral dimensions of up to 6.5 mm and thicknesses of up to 3.2 mm. From these CVD diamond layers a total of 48 plates were prepared as etalon plates with lateral dimensions of typically 4.0×4.0 mm and thicknesses of 1.2510±0.00025 mm.

Surface roughness for 15 of these plates was measured with a Zygo NewView 5000 scanning white light interferometer using a 20× magnification interferometric objective of the Mireau type and the Zygo MetroPro software package. Zoom was set at 1×. Camera resolution was 640×460 pixels with 20 Hz refresh rate. Field of view was 0.36×0.27 mm and the lateral resolution was 0.56 micron. A software bandpass filter was used with cutoff spatial frequencies of 12.5 and 400 lines/mm. A least squares fit to the surface profile was made in which the piston, tilt, power and astigmatism related to the overall surface position, angular orientation and form were removed. The remaining deviations from the reference surface thus defined were filtered with the bandpass filter and the root-mean-square value of the deviations was calculated. The roughness thus determined was found to vary between 0.5 and 1.5 nm between plates with an average value of 0.92 nm and standard deviation of 0.11 nm. Individual plates showed a much smaller standard deviation of less than 0.05 nm when measuring at 5 different randomly chosen positions over the full 4.0×4.0 mm surface area Example 9

A set of five samples was measured, of which four were single crystal CVD samples and one was a IIa natural diamond sample. The details of the samples are given in Table 1 below.

TABLE 1

Samples used for scatter measurements

| Sample Number | ID | Thickness, μm | Dimensions, mm | Process (based on that of Example 1) |
|---|---|---|---|---|
| 1 | SM1 | 1352 | 4.61 × 4.28 | 5 ppm $N_2$, |
| 2 | SM2 | 1471 | 5.74 × 5.56 | 5 ppm $N_2$, 210 × $10^2$ Pa |
| 3 | SM3 | 428 | 4.96 × 3.34 | 1 ppm $N_2$, |
| 4 | SM4 | 912 | 6.60 × 6.09 | 0 $N_2$ (<300 ppb) |
| 5 | AM1 | 942 | 5.17 × 3.36 | Natural IIa diamond. |

The samples were all carefully prepared with an optical polish with their major faces as close to [001] as is possible, typically within 1.5°.

Prior to measurement, all the samples were cleaned in a strongly oxidising mixture of hot concentrated sulphuric acid and potassium nitrate to remove any traces of surface contamination. After cleaning great care was taken to avoid re-contaminating the surfaces with anything that could cause extraneous surface scatter effects.

The total scattering power (TSP) at 1.064 μm was measured and calculated according to the method described earlier, and the values are shown in Table 2.

TABLE 2

TSP values at 1.064 μm for the five samples under investigation

| Sample | Total Scattered Power, % Angular Range | | |
|---|---|---|---|
| | 2.5°-87.5° | 3.5°-87.5° | 4.5°-87.5° |
| 1 | 0.122741 | 0.071681 | 0.06083 |
| 2 | 0.198536 | 0.162015 | 0.101446 |
| 3 | 0.144404 | 0.129007 | 0.118031 |
| 4 | 0.651108 | 0.517491 | 0.251997 |
| 5 | 0.672936 | 0.445124 | 0.114724 |

This data shows that material grown without N deliberately added has a substantially higher scatter than material grown with some nitrogen added. This is consistent with observations that the stress level (as revealed by birefringence) is higher. In comparison there appears to be relatively little difference between the three samples grown with different levels of nitrogen in the process and different process pressures although there are small variations. The high values of scatter for both the CVD grown without nitrogen and the natural type IIa stone shows the particular benefit of CVD diamond synthesised by the method revealed here, and as natural type IIa diamond is known to contain stress and dislocations the scatter is presumably by a similar mechanism.

Example 10

A homoepitaxial CVD diamond layer was synthesised according to the method described in Example 1. It was then prepared as an optical plate, E10.1, with six polished {100} faces and with dimensions of 4.00 mm×3.65 mm×1.31 mm.

Sets of Deltascan images, each covering 1 mm×0.75 mm, were recorded at a wavelength of 589.6 nm for each of the three mutually perpendicular viewing directions normal to the faces of the sample. Each Deltascan sin δ image was analysed for the maximum values of sin δ in the manner described earlier, using 100% of the data obtained within the frame.

The maximum value of sin δ for the sin δ map recorded with the viewing direction parallel to the 4.00 mm dimension of the plate was 0.1. Likewise, the maximum value of sin δ for the sin δ map recorded with the viewing direction parallel to the 3.65 mm dimension of the plate was 0.1. A maximum value of $\Delta n_{[average]}$, the average value of the difference between the refractive index for light polarised parallel to the slow and fast axes, was then calculated for each of these two viewing orientations and found to be approximately $3 \times 10^{-6}$.

The values obtained with the viewing direction perpendicular to the two largest dimensions and parallel to the 1.31 mm dimension are shown in the sin δ map below. This viewing direction corresponds to the growth direction of the CVD diamond layer, and thus is parallel to the dominant direction of dislocations in the material.

FIG. 13 is the Deltascan map of sample E10.1, with the viewing direction parallel to the 1.31 mm dimension of the plate, showing the maximum value of |sin δ| in each frame of 1 mm×0.75 mm.

The corresponding maximum values of $\Delta n_{[average]}$ for each frame in this viewing direction can be calculated based on the corresponding sin δ value and the sample thickness, with the values given below:

| Sin δ | 0.10 | 0.20 | 0.30 |
|---|---|---|---|
| Δn | $7.2 \times 10^{-6}$ | $1.4 \times 10^{-5}$ | $2.2 \times 10^{-5}$ |

In some of the more demanding optical applications, the presence of randomly scattered points, or even a single point, of higher stress may be limiting. This data, using every data pixel measured across the sample, shows that material grown using the method of the invention can achieve extremely low levels of strain related birefringence both generally across the sample and also locally.

Example 11

Quantitative luminescence measurements were made on a range of as grown and annealed single crystal CVD diamond samples grown according to the method in example 1. In each case the measurements were made after the removal of the {100} synthetic Ib substrate on which the sample was originally grown. The growth conditions favoured the formation of predominantly <100> growth sector diamond material with uniform luminescence properties as judged by luminescence imaging. Any small additional growth sectors at the edge of the sample with different luminescence properties were removed before the measurements were made.

The luminescence measurements were made at 77K using the method described earlier, and were normalised relative to the 1332 diamond Raman line, also as described earlier. The results obtained are shown in Table 3 below:

TABLE 3

Samples used for luminescence measurements

| Sample | Raman normalised intensity of 575 nm PL line | Raman normalised intensity of 637 nm PL line | Annealing treatment |
|---|---|---|---|
| 1 | 126.7 | 56.57 | None (As-grown) |
| 2 | 101.3 | 50.8 | None (As-grown) |
| 3 | 141.6 | 67.8 | None (As-grown) |
| 4 | 1.09 | 1.26 | 24 hours at 1800° C., 75 kBar |
| 5 | 1.99 | 0.76 | 4 hours at 1950° C., 75 kBar |
| 6 | 0.17 | 0.22 | 4 hours at 2400° C., 80 kBar |
| 7 | 0.16 | 0.63 | 24 hours at 2100° C., 80 kBar |
| 8 | 1.09 | 0.68 | 24 hours at 2250° C., 80 kBar |
| 9 | 0.39 | 0.70 | 4 hours at 2400° C., 80 kBar |

The absolute value of the upper level of 575 nm and 637 nm PL intensity is in part determined by the nitrogen concentration in the growth process, but can thus be advantageously reduced by annealing as demonstrated here.

Example 12

8 sets of homoepitaxial CVD diamond plates were synthesised according to the method described in Example 1. From these sets in total 48 plates were prepared as etalon plates with lateral dimensions of typically 3.5×3.5 mm and thicknesses approximately 1.255±0.005 mm.

The optical homogeneity of 6 etalon plates, originating from 4 different sets, were measured using a Zygo GPI phase shifting 633 nm laser Fizeau-type interferometer. The scanned area was typically 3.2×3.2 mm.

An effective optical homogeneity is defined in terms of the largest peak-to-valley variation (PV) of the wavefront difference of the beam transmitted through the etalon and the unperturbed beam, after removal of the variations due to long-scale shape. The Zygo GPI interferometer software option to remove the tilt from the wavefront difference removes the non-parallelism of the front and back face of the sample, whereas the power and astigmatism software options remove the cumulative effect of the curvatures of the surfaces. In this way an effective maximum variation in the refractive index over the measured area can be defined by the relation $$\Delta n = \frac{PV(\text{fringe}) \times \lambda/2}{d}$$

In Table 4 below the measured PV values are tabulated for the case that only the tilt is removed and for the case that all shape factors are removed. The lower PV values in the second case as compared to the first indicates that there are some scale shape effects due to non flatness of the plate surfaces still present, although it can not be excluded that also some of the (large scale) variation of the refractive index is filtered out in this way.

The effective optical inhomogeneity $\Delta n$ over the plates, determined in this way, is less than approximately $8\times10^{-5}$ and more than approximately $4\times10^{-5}$.

The variation between plates from different growth sets is about $1\times10^{-5}$.

TABLE 4

Samples used for optical homogeneity measurements

| | PV (fringe) | | $\Delta n$ ($\times 10^{-5}$) | |
|---|---|---|---|---|
| Sample | Tilt removed | Tilt, Curvature, Astigmatism removed | Tilt removed | Tilt, Curvature, Astigmatism removed |
| 0005-2 | 0.262 | 0.221 | 6.6 | 5.6 |
| 0044-8 | 0.285 | | 7.2 | |
| 0044-10 | 0.344 | 0.141 | 8.7 | 3.6 |
| 0053-11 | 0.290 | 0.231 | 7.3 | 5.8 |
| 0052-2 | 0.320 | 0.279 | 8.1 | 7.1 |
| 0052-12 | 0.293 | 0.167 | 7.4 | 4.2 |
| average | | | 7.6 | 5.3 |
| standard deviation | | | 0.7 | 1.4 |

Example 13

2 sets of homoepitaxial CVD diamond plates were synthesised according to the method described in Example 1. From these sets 50 uncoated etalons were prepared with lateral dimensions of typically 1.5×1.5 mm and thicknesses approximately 1.250 mm. For 6 etalons the insertion loss was determined by measuring the maximum transmitted light intensity $I_p$ of the transmission spectrum of each etalon at the beginning and at the end of the C-band, thus at approximately 192200 GHz and 197200 GHz, using a pinhole with a diameter of 1.2 mm positioned centered on the etalon front face.

In a separate measurement the transmitted light intensity $I_o$ was measured at the same frequencies, without the etalon, but with the pinhole in place.

The relative difference in transmitted light intensities is defined in terms of the insertion loss and is calculated according to equation 5, and set out in Table 5.

The insertion loss of real etalon is reduced compared to that of an ideal etalon, which has an insertion loss of 0 dB, because of a combination of several factors, the most important being the absorption of incident light in the bulk, surface scatter due to imperfect finish of the surfaces (surface roughness) and non-parallelism of the outer faces. It can be deduced from different measurements on the contrast ratio that for these etalons the non-parallelism and surface scatter can largely explain the measured insertion losses.

TABLE 5

Samples used for insertion loss measurements

| | Insertion loss (dB) | |
|---|---|---|
| Etalon Number | @ 197200 GHz | @ 192200 GHz |
| 1 | −0.39 | −0.38 |
| 2 | −0.34 | −0.34 |
| 3 | −0.23 | −0.23 |
| 4 | −0.29 | −0.34 |
| 5 | −0.29 | −0.28 |
| 6 | −0.25 | −0.23 |

Example 14

A range of single crystal diamond samples were synthesised according to the general method of Example 1, the variations on this method being given in the Table 6 below. After synthesis these samples were prepared as optical plates by careful surface polishing, resulting in the dimensions given. For comparison, optical grade polycrystalline diamond with an optical polish was also included in subsequent measurements.

TABLE 6

Samples used for absorption measurements

| Sample | Thickness (µm) | Diameter (mm) | N2 conc. (ppm, $N_2$) | Comments |
|---|---|---|---|---|
| E14.1 | 1352 | 4.12 | 5 | 330 × $10^2$ Pa |
| E14.2 | 606 | 5.08 | 1 | |
| E14.3 | 590 | 5.06 | 1 | |
| E14.4 | 1395 | 5.14 | 2.5 | 3.5% $CH_4$ |
| E14.5 | 608 | 5.09 | 0 | Optical grade polycrystalline diamond |

Measurement of absorption was made as reported earlier, and the results are shown in Table 7 below:

TABLE 7

Samples used for absorption coefficient measurements

| | Absorption Coeff. (cm−1) | |
|---|---|---|
| Sample | At 10.6 µm | At 1.064 µm |
| E14.1 | — | 0.0483 |
| E14.2 | 0.0262 | 0.0071 |
| E14.3 | 0.0264 | 0.0077 |
| E14.4 | — | 0.0464 |
| E14.5 | 0.0362 | 0.119 |

Example 15

3 sets of homoepitaxial CVD diamond layers were synthesised according to the method described in Example 1. The CVD diamond layers had lateral dimensions of up to 6.5 mm and thicknesses of up to 3.2 mm. From these CVD diamond layers a total of 11 etalon plates were prepared with thicknesses varying between 1.250 mm and 1.258 mm. The thickness of each plate was measured at several positions with a micrometer to an accuracy of better than ±0.5 μm. Over each plate no thickness variations were found within this accuracy. The lateral dimensions of the plates are shown in Table 8.

TABLE 8

Figure 9:
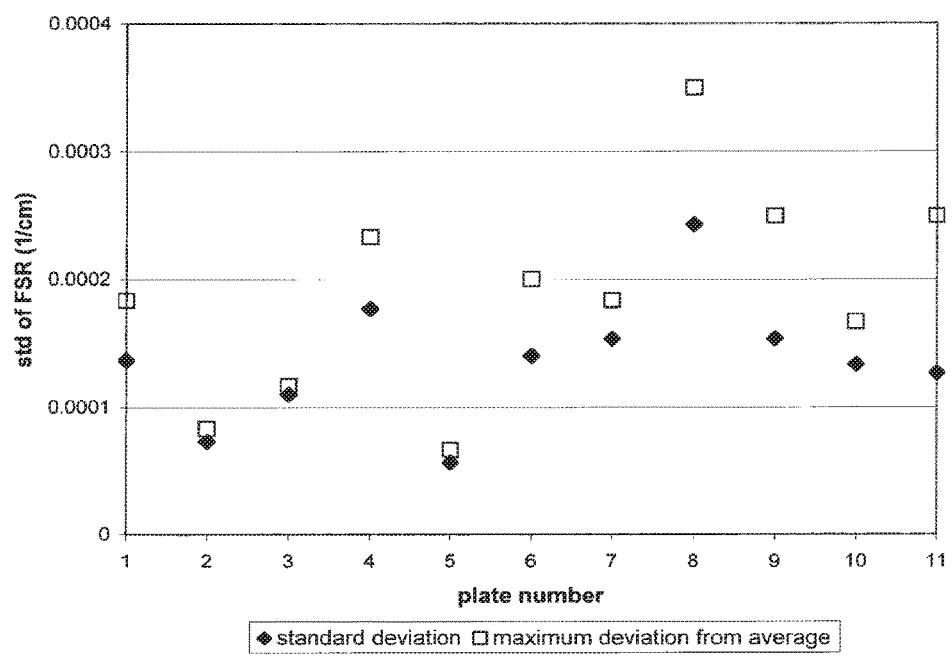
FIG. 9 is a graphical representation of the FSR data measured as described in Example 15. Data are shown for each of 11 CVD single crystal plates, showing the standard deviation of the FSR measurements made on the plate and the maximum deviation of any measurement from the average.

Samples used for FSR measurements shown in FIG. 9

| ID number | Length (mm) | Width (mm) |
|---|---|---|
| 1 | 4.75 | 4.81 |
| 2 | 4.64 | 4.63 |
| 3 | 4.73 | 4.78 |
| 4 | 5.2 | 5.24 |
| 5 | 4.72 | 4.74 |
| 6 | 4.76 | 4.79 |
| 7 | 4.7 | 4.7 |
| 8 | 5.9 | 5.9 |
| 9 | 5.9 | 5.9 |
| 10 | 5.8 | 5.8 |
| 11 | 6.34 | 6.4 |

The FSR over the C-band (197200-192200 GHz) was determined on several positions (4 to 9 positions with average of 6.7) on each of the etalon plates by measuring the frequencies of the peak position of the etalon transmission peak nearest to the start and end position of the C-band for perpendicular incident light. The distances from each measurement position to the next nearest measurement position was at least 1.6 mm. A 1 mm diameter beam was used, defined by using a metal plate with an array of pinholes fixed to the etalon plate. By moving the plate in the beam by means of micrometers each of the positions could be illuminated separately. The effective FSR of each etalon is calculated by dividing the frequency interval between the two extreme peaks by the number of periods in the transmission spectrum (For this etalon thickness and frequency band typically 100 periods).

The average FSR over all positions on one plate was calculated for each plate, as well as the standard deviation $\sigma_{FSR}$ and the maximum error $\Delta FSR_{max}$.

This maximum error is defined as $$\Delta FSR_{max} = \frac{\max_i[FSR_i] - \min_i[FSR_i]}{2}$$

where the index i stands for the different positions on a plate.

The FSR of these plates was approximately 1.66 cm$^{-1}$. FIG. 9 shows the standard deviation and the maximum error of the FSR for the different etalon plates. The average standard deviation is $\sigma_{FSR,av}=1.37\times10^{-4}$ cm$^{-1}$. The largest maximum error that was found is $3.5\times10^{-4}$ cm$^{-1}$, whereas the smallest error is as low as $6.7\times10^{-5}$ cm$^{-1}$.

The invention claimed is:

1. A CVD single crystal diamond material comprising:
a low optical birefringence, indicative of low strain, such that when a sample of the material is prepared as an optical plate having a thickness of at least 0.5 mm and measured at room temperature, nominally 20° C., over an area of at least 1.3 mm×1.3 mm, |sin δ|, the modulus of the sine of the phase shift, for at least 98% of the measured area of the sample remains in first order, such that δ does not exceed π/2, and |sin δ| does not exceed 0.9.

2. A CVD single crystal diamond material according to claim 1, wherein |sin δ| does not exceed 0.9 over 100% of the measured area of the sample.

3. A CVD single crystal diamond material according to claim 1, wherein |sin δ| does not exceed 0.6 over at least 98% of the measured area of the sample.

4. A CVD single crystal diamond material according to claim 1, wherein |sin δ| does not exceed 0.6 over at least 100% of the measured area of the sample.

5. A CVD single crystal diamond material according to claim 1, wherein the diamond material has a single substitutional nitrogen concentration of more than $3\times10^{15}$ atoms/cm$^3$ and less than $5\times10^{17}$ atoms/cm$^3$ as measured by electron paramagnetic resonance (EPR).

6. A CVD single crystal diamond material according to claim 5, wherein the single substitutional nitrogen concentration is less than $2\times10^{17}$ atoms/cm$^3$ as measured by electron paramagnetic resonance (EPR).

7. A CVD single crystal diamond material according to claim 5, wherein the single substitutional nitrogen concentration is more than $1\times10^{16}$ atoms/cm$^3$ as measured by electron paramagnetic resonance (EPR).

8. A CVD single crystal diamond material according to claim 1, comprising a low and uniform optical absorption such that a sample of a specified thickness of at least 0.5 mm has an optical absorption coefficient at a wavelength of 1.06 μm of less than 0.09 cm$^{-1}$.

9. A CVD single crystal diamond material comprising:
a low optical birefringence, indicative of low strain, such that when a sample of the material is prepared as an optical plate of at least 0.5 mm thickness and measured at room temperature, nominally 20° C., over a specified area of at least 1.3 mm×1.3 mm, for 98% of the area analysed, the sample remains in first order, δ not exceeding π/2, and a maximum value of $\Delta n_{[average]}$, the average value of the difference between the refractive index for light polarised parallel to the slow and fast axes averaged over the sample thickness, does not exceed $1.5\times10^{-4}$.

10. A CVD single crystal diamond material according to claim 9, wherein $\Delta n_{[average]}$ does not exceed $1.5\times10^{-4}$ over 100% of the measured area of the sample.

11. A CVD single crystal diamond material according to claim 9, wherein $\Delta n_{[average]}$ does not exceed $5\times10^{-5}$ over 98% of the measured area of the sample.

12. A CVD single crystal diamond material according to claim 9, wherein $\Delta n_{[average]}$ does not exceed $5\times10^{-5}$ over 100% of the measured area of the sample.

13. A CVD single crystal diamond material according to claim 9, wherein the diamond material has a single substitutional nitrogen concentration of more than $3\times10^{15}$ atoms/cm$^3$ and less than $5\times10^{17}$ atoms/cm$^3$ as measured by electron paramagnetic resonance (EPR).

14. A CVD single crystal diamond material according to claim 13, wherein the single substitutional nitrogen concentration is less than $2\times10^{17}$ atoms/cm$^3$ as measured by electron paramagnetic resonance (EPR).

15. A CVD single crystal diamond material according to claim 13, wherein the single substitutional nitrogen concentration is more than $1\times10^{16}$ atoms/cm$^3$ as measured by electron paramagnetic resonance (EPR).

16. A CVD single crystal diamond material according to claim 9, comprising a low and uniform optical absorption such that a sample of a specified thickness of at least 0.5 mm has an optical absorption coefficient at a wavelength of 1.06 µm of less than 0.09 cm$^{-1}$.

\* \* \* \* \*